(12) United States Patent
Lefurgy et al.

(10) Patent No.: US 11,474,582 B2
(45) Date of Patent: Oct. 18, 2022

(54) AUTOMATED VALIDATION OF POWER TOPOLOGY VIA POWER STATE TRANSITIONING

(71) Applicant: International Business Machines Corporation, Armonk, NY (US)

(72) Inventors: Charles Lefurgy, Austin, TX (US); Malcolm S. Allen-Ware, Tucson, AZ (US); Amos A. Omokpo, Richmond, TX (US); Karthick Rajamani, Austin, TX (US); Guillermo Jesus Silva, Cedar Park, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 207 days.

(21) Appl. No.: 16/791,638

(22) Filed: Feb. 14, 2020

(65) Prior Publication Data
US 2021/0255684 A1 Aug. 19, 2021

(51) Int. Cl.
*G06F 1/28* (2006.01)
*H04L 41/12* (2022.01)
*H04L 41/0853* (2022.01)
*G01R 19/00* (2006.01)

(52) U.S. Cl.
CPC ............ *G06F 1/28* (2013.01); *G01R 19/00* (2013.01); *H04L 41/0856* (2013.01); *H04L 41/12* (2013.01)

(58) Field of Classification Search
CPC ....... G06F 1/28; G01R 19/00; H04L 41/0856; H04L 41/12
See application file for complete search history.

(56) References Cited

U.S. PATENT DOCUMENTS

| 8,718,829 | B2 | 5/2014 | Coyne et al. |
| 8,891,588 | B1* | 11/2014 | Hui .................. H04L 45/306 |
| | | | 375/133 |
| 8,996,323 | B1 | 3/2015 | Morales et al. |
| 9,917,736 | B2 | 3/2018 | Jubran et al. |
| 9,923,775 | B2 | 3/2018 | Jubran et al. |
| 10,025,337 | B2 | 7/2018 | Hancock et al. |

(Continued)

OTHER PUBLICATIONS

Gillen, "Power Concepts and Solutions for IBM System x and BladeCenter," http://www.ibm.com/support/techdocs/atsmastr.nsf/WebIndex/WP100778, Version 2.01, Jul. 24, 2008, 50 pages.

(Continued)

*Primary Examiner* — Aurel Prifti
(74) *Attorney, Agent, or Firm* — Amin, Turocy & Watson, LLP

(57) ABSTRACT

Systems and techniques that facilitate automated validation of power topology are provided. In various embodiments, a control component can transmit a transition command to a power-distribution node of a data center, wherein the transition command can cause an outlet of the power-distribution node to transition between power states. In various aspects, a verification component can verify that a power-consumption node of the data center is connected to the outlet by comparing a pre-transition power characteristic of the power-consumption node with a post-transition power characteristic of the power-consumption node.

17 Claims, 21 Drawing Sheets

(56) References Cited

U.S. PATENT DOCUMENTS

| | | | |
|---|---|---|---|
| 10,050,670 B1* | 8/2018 | Hill | H02J 13/00 |
| 10,061,097 B2 | 8/2018 | Morales et al. | |
| 10,126,999 B1* | 11/2018 | Redman | G09G 5/397 |
| 2009/0189774 A1* | 7/2009 | Brundridge | H02J 13/00001 |
| | | | 340/654 |
| 2009/0236909 A1* | 9/2009 | Aldag | H01R 25/142 |
| | | | 307/39 |
| 2009/0307515 A1* | 12/2009 | Bandholz | G06F 1/26 |
| | | | 713/340 |
| 2010/0005331 A1* | 1/2010 | Somasundaram | G06F 1/26 |
| | | | 713/340 |
| 2010/0145542 A1* | 6/2010 | Chapel | H02J 13/00034 |
| | | | 700/295 |
| 2011/0320949 A1* | 12/2011 | Ohki | G06F 40/177 |
| | | | 715/727 |
| 2012/0068718 A1 | 3/2012 | Hochwald et al. | |
| 2013/0054999 A1 | 2/2013 | Allen-Ware et al. | |
| 2014/0013126 A1 | 1/2014 | Allen-Ware et al. | |
| 2014/0101467 A1* | 4/2014 | Jubran | H04L 41/0856 |
| | | | 713/310 |
| 2015/0012625 A1* | 1/2015 | Patwardhan | H04L 61/103 |
| | | | 709/221 |
| 2015/0256409 A1* | 9/2015 | Masuyama | H04L 41/12 |
| | | | 370/254 |
| 2016/0156522 A1* | 6/2016 | Jubran | H04L 41/12 |
| | | | 709/224 |
| 2016/0195911 A1* | 7/2016 | Chapel | G06F 1/28 |
| | | | 713/340 |
| 2016/0282823 A1* | 9/2016 | Wang | G06Q 50/06 |
| 2017/0317494 A1* | 11/2017 | Chapel | H02J 13/00034 |
| 2018/0210538 A1 | 7/2018 | Aimone | |
| 2019/0089594 A1 | 3/2019 | Jubran et al. | |
| 2019/0349426 A1* | 11/2019 | Smith | H04L 63/123 |
| 2021/0076529 A1* | 3/2021 | Pachoud | H02J 9/061 |
| 2021/0110024 A1* | 4/2021 | Bein | G06F 21/81 |
| 2021/0182395 A1* | 6/2021 | Shattuck | G06F 1/266 |
| 2021/0356530 A1* | 11/2021 | Yang | G06F 1/28 |

OTHER PUBLICATIONS

Disclosed Anonymously, "Method and system for automatic power topology generation between devices and PDU," IP.com No. IPCOM000202009D, Dec. 1, 2010, 6 pages.

Disclosed Anonymously, "Smarter Rack Power Distribution Unit," IP.com No. IPCOM000228099D, Jun. 6, 2013, 3 pages.

Disclosed Anonymously, "A new type of 0U PDU for server rack," IP.com No. IPCOM000238045D, Jul. 29, 2014, 7 pages.

Pelley et al., "Power Routing: Dynamic Power Provisioning in the Data Center," ASPLOS'10, Mar. 13-17, 2010, 12 pages.

Mell et al., "The NIST Definition of Cloud Computing," Recommendations of the National Institute of Standards and Technology, NIST Special Publication 800-145, Sep. 2011, 7 pages.

* cited by examiner

US 11,474,582 B2

AUTOMATED VALIDATION OF POWER TOPOLOGY VIA POWER STATE TRANSITIONING

BACKGROUND

The subject disclosure relates to validation of power topology, and more specifically to automatically validating that a physical power topology of a data center matches a planned or intended power topology specified in inventory records of the data center.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate automated validation of power topology via power state transitioning are described.

According to one or more embodiments, a system is provided. The system can comprise a memory that can store computer-executable components. The system can further comprise a processor that can be operably coupled to the memory and that can execute the computer-executable components stored in the memory. In various embodiments, the computer-executable components can comprise a control component that can transmit a transition command to a power-distribution node of a data center. In various aspects, the transition command can cause an outlet of the power-distribution node to transition between power states. In various embodiments, the computer-executable components can comprise a verification component that can verify that a power-consumption node of the data center is connected to the outlet of the power-distribution node by comparing a pre-transition power characteristic of the power-consumption node with a post-transition power characteristic of the power-consumption node.

According to one or more embodiments, the above-described system can be implemented as a computer-implemented method or as a computer program product.

DETAILED DESCRIPTION

Figure 1:
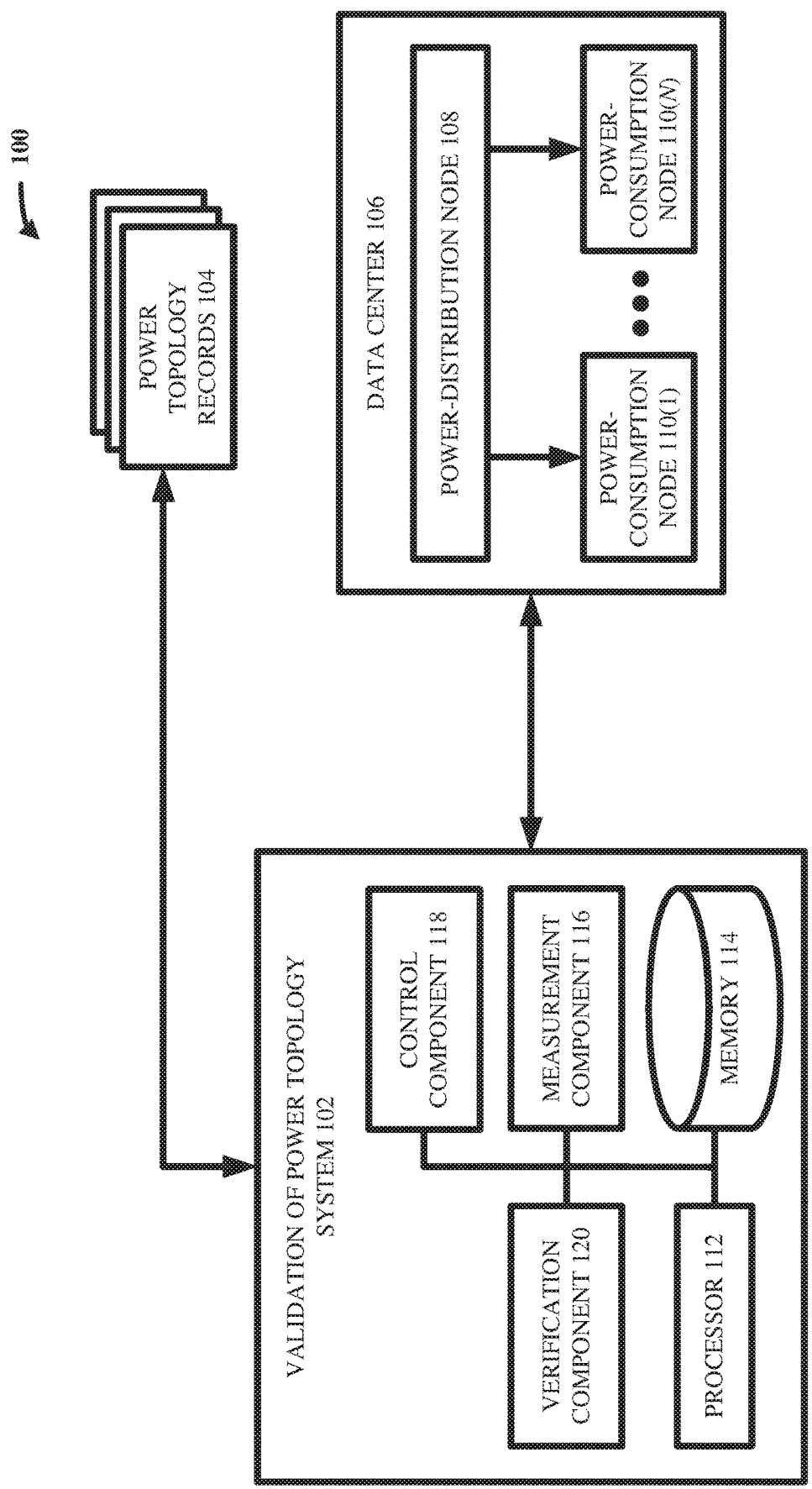
FIG. 1 illustrates a block diagram of an example, non-limiting system that facilitates automated validation of power topology via power state transitioning in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A data center is a physical space (e.g., a building, a dedicated part of a building, multiple buildings, and/or any other suitable space) for housing computer systems and associated components, such as information technology (IT) systems or telecommunications systems. Generally, a data center can include information technology component inventory (e.g., servers, memory/storage devices, switches, and/or any other suitable IT devices) and can also include electrical infrastructure components (e.g., rack power distribution units (PDUs) such as power strips, remote power panels (RPPs) having multiple circuits and circuit breakers, uninterruptible power supplies (UPSs), and/or any other suitable electrical infrastructure devices).

A data center can be associated with records (e.g., inventory records, design records, maintenance records, and/or any other suitable electronic records/documentation) that specify the power topology of the data center (e.g., the records can specify which power supply unit of which server is connected to which outlet of which rack PDU, can specify which rack PDU is connected to which circuit of which RPP, can specify which RPP is connected to which outlet of which UPS, and/or can specify any other suitable power connections in the data center). Such records can be very useful for maintenance and troubleshooting purposes.

In various cases, it is possible that the power topology on record does not match the actual/physical power topology implemented in the data center. For instance, the records can indicate that power supply unit A (PSU A) of server B is connected to outlet C of rack PDU D. However, in reality, the PSU A of server B can instead be connected to outlet E of rack PDU F. Such inconsistency can be the result of human error (e.g., the IT and electrical infrastructure equipment could have been mis-wired during installation or maintenance, or the records could have been mistakenly updated). In some instances, such inconsistencies can cause unexpected power faults in the data center (e.g., if redundant power supply units of a single server are mis-wired to be on the same building power feed, then, if that power feed fails, the server can lose all power rather than getting power from the redundant power feed). Validation of data center power topology can identify and thus help to prevent such mismatches between actual and on-record power topologies, and thus can be beneficial.

Since data centers can be extremely large and/or full (e.g., housing tens of thousands to hundreds of thousands of servers, and/or any other suitable number of servers), manually validating power topology can be tedious, time-consuming, and error-prone. So, systems and/or techniques for facilitating automated validation of power topology can be desirable.

Embodiments described herein include systems, computer-implemented methods, apparatus, and/or computer program products that can facilitate automated validation of power topology in a data center via power state transitioning. In various embodiments, a data center can be associated with power topology records (e.g., electronic records) that can specify/indicate that a particular power-consumption node of the data center is connected to a particular outlet of a particular power-distribution node of the data center. In some instances, the power-consumption node can be a power supply unit of a server, and the power-distribution node can be a rack PDU (e.g., because the power supply unit of the server can get its electrical power from an outlet of the rack PDU). In some instances, the power-consumption node can be a rack PDU and the power-distribution node can be an RPP (e.g., because the rack PDU can get its electrical power from a circuit or circuit breaker of the RPP). In some instances, the power-consumption node can be an RPP, and the power-distribution node can be a UPS (e.g., because the RPP can get its electrical power from an outlet of the UPS).

In various aspects, embodiments of the invention can use a combination of real-time data and configuration models to validate the power topology of the data center. Specifically, in various instances, embodiments of the invention can validate whether the power-consumption node is actually connected to the outlet of the power-distribution node, as specified in the power topology records, by controlling an electrical output of one of the pieces of equipment and correspondingly measuring changes in an electrical input or electrical output of the other piece of equipment. In some cases, implementation of embodiments of the invention can validate that power infrastructure of the data center is appropriately networked for monitor and control (e.g., that servers, service processors, rack PDUs, RPPs, UPSs, and/or any other suitable devices in the data center have correct IP addresses; that power of such devices can be transitioned; and/or that power readings for such devices can be taken).

In various embodiments, a control component can transmit a transition command to the power-distribution node of the data center, where the transition command can cause the outlet of the power-distribution node to transition between power states. In some aspects, the transition command can cause the outlet of the power-distribution node to transition between an on-state and an off-state (e.g., the outlet transitions from on-state to off-state, or the outlet transitions from off-state to on-state). In some cases, the transition command can cause the outlet of the power-distribution node to transition from any suitable power state to any other suitable power state (e.g., on-state, off-state, idle-state, standby-state, sleep-state, hibernate-state, soft-off-state, mechanical-off-state).

In various embodiments, the power-distribution node can lack remote control capabilities (e.g., old RPPs can lack remotely controllable circuit breakers). In such embodiments, the control component can communicate with an entity in the data center to cause that entity to interact with the power-distribution node in order to transition the outlet of the power-distribution node between identified power states. In various instances, the control component can receive confirmation from the entity that the outlet of the power-distribution node has been transitioned between the power states identified by the control component. In various aspects, the control component can communicate with the entity via any suitable wired and/or wireless electronic connection. In various embodiments, the entity can be a remotely controllable device installed at the power-distribution node to transition identified outlets. In various embodiments, the entity can be an autonomous machine that surveys and/or maintains the data center. In various embodiments, the entity can be a human operator of the data center.

In various embodiments, a measurement component can request a pre-transition power characteristic and a post-transition power characteristic from the power-consumption node that is specified in the power topology records as being connected to the outlet of the power-distribution node. In various cases, the pre-transition power characteristic can be an electrical measurement (e.g., power measurement (W or kVA), voltage measurement (V), current measurement (A), or power state reading (on, off, standby, and/or any other suitable power state)) taken at the power-consumption node before the outlet of the power-distribution node transitions between power states. For instance, this can include measuring electrical power, voltage, or current received by the power-consumption node before the outlet of the power-distribution node transitions between power states; measuring electrical power, voltage, or current outputted by the power-consumption node before the outlet of the power-distribution node transitions between power states; or measuring power state of the power-consumption node before the outlet of the power-distribution node transitions between power states. In various cases, the post-transition power characteristic can be an electrical measurement (e.g., power measurement (W or kVA), voltage measurement (V), current measurement (A), or power state reading (on, off, standby, and/or any other suitable power state)) taken at the power-consumption node after the outlet of the power-distribution node transitions between power states. For instance, this can include measuring electrical power, voltage, or current received by the power-consumption node after the outlet of the power-distribution node transitions between power states; measuring electrical power, voltage, or current outputted by the power-consumption node after the outlet of the power-distribution node transitions between power states; or measuring power state of the power-consumption node after the outlet of the power-distribution node transitions between power states.

In various embodiments, a verification component can verify that the power-consumption node is actually connected to the outlet of the power-distribution node by comparing the pre-transition power characteristic with the post-transition power characteristic. Such comparison can reveal whether an expected change in electrical consumption, electrical output, and/or power state occurred at the power-consumption node in response to the transition at the power-distribution node. In various instances, if the power-consumption node is actually/physically connected to the outlet of the power-distribution node as specified in the power topology records, then the act of transitioning the outlet of the power-distribution node between power states can cause an expected change in the electrical measurements at and/or the power state of the power-consumption node (e.g., transitioning an outlet of a rack PDU on or off can predictably affect the electrical measurements at and/or the power state of a server PSU that receives power from that outlet; transitioning a circuit or circuit breaker of an RPP on or off can predictably affect the electrical measurements at and/or the power state of a rack PDU that receives power from that circuit or circuit breaker, or transitioning an outlet of a UPS on or off can predictably affect the electrical measurements at and/or the power state of an RPP that receives power from that outlet). On the other hand, if the power-consumption node is not actually/physically connected to the outlet of the power-distribution node, then the act of transitioning the outlet of the power-distribution node between power states can be expected to cause no or substantially no change in the electrical measurements at and/or the power state of the power-consumption node (e.g., transitioning an outlet of a rack PDU on or off can be predicted to not affect the electrical measurements at and/or the power state of a server PSU that is not connected to that outlet; transitioning a circuit or circuit breaker of an RPP on or off can be predicted to not affect the electrical measurements at and/or the power state of a rack PDU that is not connected to that circuit; or transitioning an outlet of a UPS on or off can be predicted to not affect the electrical measurements at and/or the power state of an RPP that is not connected to that outlet).

In various instances, if the post-transition power characteristic is sufficiently different from the pre-transition power characteristic, it can be inferred or determined that the power topology records and the physical power topology are consistent with respect to this particular power-consumption node and this particular power-distribution node. For instance, if comparison of the pre-transition and post-transition power characteristics shows that an expected electrical response occurred at the power-consumption node (e.g., sufficiently heightened or lowered power as the case may be, sufficiently heightened or lowered voltage as the case may be, sufficiently heightened or lowered current as the case may be, different power state, and/or any other suitable expected electrical response), it can be inferred/determined that the power-consumption node was affected by the transition at the power-distribution node, indicating that the power-consumption node is actually connected to the outlet of the power-distribution node as specified. However, in various aspects, if the post-transition power characteristic is not sufficiently different from the pre-transition power characteristic, it can be inferred or determined that the power topology records and the physical power topology are inconsistent with respect to this particular power-consumption node and this particular power-distribution node. For instance, if comparison of the pre-transition and post-transition power characteristics shows that an expected electrical response did not occur at the power-consumption node (e.g., substantially same power, substantially same voltage, substantially same current, and/or substantially same power state), it can be inferred/determined that the power-consumption node was not affected by the transition at the power-distribution node, indicating that the power-consumption node is not actually connected to the outlet of the power-distribution node, contrary to what is specified in the power topology records.

In various cases, what constitutes a sufficient difference between pre-transition and post-transition power characteristics can be a routine implementation detail that can depend on the type and/or magnitude of electrical response that is expected to occur at the power-consumption node due to the transition at the power-distribution node. This can, in turn, depend on the specific devices involved, the particular operating environment at issue, the particular power-states and/or electrical characteristics/properties of the power-distribution node and the power-consumption node, the particular electrical loads at issue, and/or any other suitable design and/or operating parameters involved.

In some cases, the power-distribution node may not be able to control electrical output and/or power states of individual outlets (e.g., although some rack PDUs (power strips) have individually-controllable outlets, others may not; although some RPPs have individually-controllable circuits or circuit breakers, others may not; although some UPSs have individually-controllable outlets, others may not). In such instances, various embodiments of the invention can transition the power-consumption node between power states and can correspondingly measure the electrical response at the power-distribution node. In such embodiments, the control component can send a transition command to the power-consumption node to cause the power-consumption node (and/or an outlet of the power-consumption node) to transition between power states and/or to alter its workload/output; the measurement component can request a pre-transition power characteristic and a post-transition power characteristic of the outlet of the power-distribution node; and the verification component can compare the pre-transition and post-transition power characteristics to determine whether or not an expected change in the electrical measurements at and/or the power state of the outlet of the power-distribution node occurred in response to the transition at the power-consumption node.

Various non-limiting advantages of various non-limiting embodiments of the invention are described below. In various instances, embodiments of the invention can be implemented as part of an inventory control software program for a data center. For instance, when new inventory and/or power connections are physically installed in the data center, an operator can enter the new power topology into the inventory control software program, and the inventory control software program (using embodiments of the invention) can facilitate automated validation of power topology via power state transitioning in order to verify that the provided/entered/recorded power topology matches the physical/actual power topology, and can accordingly update/confirm the inventory records and/or raise an alert.

In various aspects, embodiments of the invention can facilitate automated validation of power topology of a data center at installation (e.g., when new IT equipment and/or new electrical infrastructure equipment is added to the data center and before such equipment is fully in commercial use) and/or at run time (e.g., while the IT equipment and/or electrical infrastructure equipment is being commercially used in the data center). Thus, bootstrapping, down time, and/or other interruptions of the overall activities of the data center are not required for embodiments of the invention to validate a particular power connection.

In various aspects, embodiments of the invention can validate power topology of a data center without interrupting business activities of the data center. For instance, in various cases, servers of a data center can be redundantly powered by two or more PSUs, with each PSU being connected to an outlet of a corresponding rack PDU. In various embodiments of the invention, one outlet of a rack PDU can be transitioned between power states at a time, which can cause only one of the redundant PSUs of the associated server to power down, such that the server itself does not lose power and thus can continue serving clients of the data center during automated validation of power topology (e.g., each server PSU can be connected to an outlet of a rack PDU in one-to-one fashion, and so transitioning one outlet of one rack PDU at a time can affect only one server PSU). Existing systems/techniques for automated validation of power topology are not able to validate power topology of a server simultaneously as that server is serving a client.

In various aspects, embodiments of the invention can be used to validate a power connection between any suitable power-consumption node and any suitable power-distribution node in a data center, regardless of the power states of other power-consumption nodes that receive power from that same power-distribution node. For instance, embodiments of the invention can automatically validate a power connection between a PSU of a server and an outlet of a rack PDU without requiring the other server PSUs that are connected to that rack PDU to be powered down.

In various aspects, embodiments of the invention can validate not only power connections between server PSUs and rack PDUs, but also power connections between rack PDUs and RPPs and/or power connections between RPPs and UPSs. Existing systems/techniques simply do not address validating power connections between rack PDUs and RPPs and/or power connections between RPPs and UPSs.

In various aspects, embodiments of the invention can facilitate automated validation of power topology of a data center by leveraging only the existing data center IT equipment and existing data center electrical infrastructure equipment, without requiring additional hardware to be installed in the data center. For example, various embodiments of the invention do not require installation of external sensors, external waveform generators, external tonal tracers, external test signal injectors, and/or other external monitoring equipment for validation of power topology, because embodiments of the invention do not inject/add resistive loads, do not inject/add external voltages or currents, and do not inject/add other test and/or identification signals into the data center infrastructure. Instead, various embodiments of the invention automatically transition existing, controllable hardware in the data center (e.g., existing server PSUs, existing rack PDUs, existing RPPs, existing UPSs, and/or any other suitable existing devices) between power states and automatically measure corresponding electrical reactions/responses at other existing hardware in the data center. Pluralities of test signals and/or test responses are not required in various embodiments of the invention.

In various aspects, embodiments of the invention can automatically validate power topology by disconnecting power from a power-distribution node to a power-consumption node (e.g., transitioning the outlet of the power-distribution node from an on-state to an off-state), thereby creating an open-circuit between the outlet of the power-distribution node and the power-consumption node. No known validation of power topology systems/techniques are able to validate power topology by creating open circuits. Instead, known systems/techniques generally inject multitudes of test signals and watch to see which branch circuits the test signals propagate to, which requires closed circuits between the power-distribution node and the power-consumption node as well as installation of external tonal generators and tracers.

In various aspects, embodiments of the invention can facilitate automated validation of power topology without utilizing electronic communication over power lines (e.g., communication networks that allow electronic communication between IT equipment and electrical infrastructure equipment are not needed), without requiring logical network topology information (e.g., only power topology information is required), without depending on running workloads (e.g., various embodiments of the invention can function with idle equipment and/or powered-down equipment, as well as with running equipment), without adding/injecting unique identification signals/tones to already-existing power signals, and without having to alter data center installation plans (e.g., various embodiments of the invention can function to validate any suitable power connection in an existing data center infrastructure, regardless of whether the data center is completely built or partially built).

In various aspects, embodiments of the invention can facilitate automated validation of power topology of redundantly-powered equipment (e.g., a server with redundant PSUs). In various instances, embodiments of the invention can automatically validate a first power connection between a first PSU of a server and an outlet of a first rack PDU, and can subsequently automatically validate a second power connection between a second PSU of the server and an outlet of a second rack PDU. In various cases, the first and second power connections can be validated at different times since doing otherwise could, in some instances, power down both PSUs of the server at the same time which could bring down the server and thus interrupt business activities of the data center. Moreover, in various cases, embodiments of the invention can automatically examine (e.g., via any suitable artificial intelligence and/or machine learning techniques) the power topology records to determine whether or not the first rack PDU gets its power from the same building feed as the second rack PDU (e.g., by following the power topology back to the roots in the records to ensure that the first and second rack PDUs ultimately receive power from different building feeds, and/or by checking the building feed labels associated with the first and second rack PDUs in the records). In stark contrast, known systems/techniques do not and cannot validate redundant power topology connections. After all, known systems/techniques rely on injection of signals/tones which then propagate throughout branch circuits. The signal/tone will propagate through all connected equipment; so, if the tone is not detected at an expected location, it can be determined that the expected location is not connected to the signal/tone injection site. However, redundantly powered servers are connected to two or more PSUs, and so a signal/tone injected on a circuit branch of one PSU can always be detected in the circuit branches of other PSUs, regardless of whether those PSUs receive their power from different building feeds. Embodiments of the invention can address such issues by transitioning and/or measuring electrical behavior at individual server PSUs.

Various embodiments of the invention herein can employ artificial intelligence (AI) to facilitate automating one or more features of the present invention. The components can employ various AI-based schemes for carrying out various embodiments/examples disclosed herein. In order to provide for or aid in the numerous determinations (e.g., determine, ascertain, infer, calculate, predict, prognose, estimate, derive, forecast, detect, compute) of the present invention, components of the present invention can examine the entirety or a subset of the data to which it is granted access and can provide for reasoning about or determine states of the system and/or environment from a set of observations as captured via events and/or data. Determinations can be employed to identify a specific context or action, or can generate a probability distribution over states, for example. The determinations can be probabilistic; that is, the computation of a probability distribution over states of interest based on a consideration of data and events. Determinations can also refer to techniques employed for composing higher-level events from a set of events and/or data.

Such determinations can result in the construction of new events or actions from a set of observed events and/or stored event data, whether or not the events are correlated in close temporal proximity, and whether the events and data come from one or several event and data sources. Components disclosed herein can employ various classification (explicitly trained (e.g., via training data) as well as implicitly trained (e.g., via observing behavior, preferences, historical information, receiving extrinsic information)) schemes and/or systems (e.g., support vector machines, neural networks, expert systems, Bayesian belief networks, fuzzy logic, data fusion engines) in connection with performing automatic and/or determined action in connection with the claimed subject matter. Thus, classification schemes and/or systems can be used to automatically learn and perform a number of functions, actions, and/or determinations.

A classifier can map an input attribute vector, $z=(z1, z2, z3, z4, zn)$, to a confidence that the input belongs to a class, as by $f(z)=confidence(class)$. Such classification can employ a probabilistic and/or statistical-based analysis (e.g., factoring into the analysis utilities and costs) to determinate an action to be automatically performed. A support vector machine (SVM) can be an example of a classifier that can be employed. The SVM operates by finding a hyper-surface in the space of possible inputs, where the hyper-surface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and/or probabilistic classification models providing different patterns of independence, any of which can be employed. Classification as used herein also is inclusive of statistical regression that is utilized to develop models of priority.

Various embodiments of the invention can be employed to use hardware and/or software to solve problems that are highly technical in nature (e.g., to facilitate automated validation of data center power topology via power state transitioning), that are not abstract and that cannot be performed as a set of mental acts by a human. Further, some of the processes performed can be performed by a specialized computer for carrying out defined tasks related to automated validation of data center power topology (e.g., transmitting a transition command to an existing power-distribution node of the data center to cause an outlet of the power-distribution node to transition between power states, measuring pre-transition and post-transition power characteristics of an existing power-consumption node of the data center that is specified as being connected to the outlet of the power-distribution node, comparing the pre-transition and post-transition power characteristics to verify that the power-consumption node is actually connected to the outlet of the power-distribution node). Various embodiments of the invention can leverage power state control and transitioning of existing data center hardware into a practical application that can provide technical improvements to and solve problems that arise in the field of automated validation of power topology. Various embodiments of the invention can facilitate validation of power topology by controlling real-world devices in a data center (e.g., by transitioning power states of server PSUs, rack PDUs, RPPs, UPSs, and/or any other suitable devices in the data center). Various embodiments of the invention can control real-world devices based on such validation of power topology (e.g., controlling a word processor to update, edit, and/or annotate power topology records and/or inventory records of the data center according to the validation or invalidation of the power topology of the data center; controlling transmitters to send alert messages or success messages to operators of the data center and/or to order, schedule, and/or purchase maintenance services for the data center based on the validation or invalidation of the power topology of the data center; controlling power levels outputted by certain power-distribution nodes and/or power levels consumed by certain power-consumption nodes based on the validation or invalidation of the power topology). As described herein, embodiments of the invention can facilitate automated validation of power topology of a data center using the existing hardware in the data center (e.g., without requiring additional signal generators or tracers), without interrupting business operations of the data center (e.g., power validation of a server PSU can be facilitated while the server is serving a client), and while taking into consideration redundant power supplies (e.g., the techniques disclosed herein allow validation of individual server PSUs). Such embodiments thus constitute a concrete and tangible technical improvement in the prior art.

FIG. 1 illustrates a block diagram of an example, non-limiting system 100 that can facilitate automated validation of power topology via power state transitioning in accordance with one or more embodiments described herein. As shown, a validation of power topology system 102 (hereafter "VPT system 102") can determine whether the power topology of a data center 106 matches (e.g., is consistent with) the power topology specified in power topology records 104 that are associated with the data center 106.

In various embodiments, the data center 106 can be any suitable data center of any suitable size that contains any suitable information technology (IT) and/or telecommunications equipment (e.g., servers, processors, computer memories and storage devices, switches, and/or any other suitable devices) and that contains any suitable electrical infrastructure equipment (e.g., power supply units (PSUs) for servers, rack power distribution units (PDUs) such as power strips with individually-controllable outlets, remote power panels (RPPs) with circuits and circuit breakers, uninterruptible power supplies (UPSs), and/or any other suitable devices). As shown, in various aspects, the data center 106 can include a power-distribution node 108 and one or more power-consumption nodes 110(1)-(N), for any suitable/desired positive integer N. As shown, the power-consumption node 110(1) can, in various embodiments, receive power from a first outlet of the power-distribution node 108, and the power-consumption node 110(N) can receive power from an N-th outlet of the power-distribution node 108. For example, in some embodiments, the power-distribution node 108 can be a rack PDU (e.g., a smart power strip with individually-controllable outlets that provides power to a rack of servers in the data center 106), and the power-consumption nodes 110(1)-(N) can be server PSUs (e.g., AC-to-DC converters/regulators that convert the main AC electricity received from a rack PDU into low-voltage, regulated DC electricity that can be used for processing by servers). As another example, in some embodiments, the power-distribution node 108 can be an RPP (e.g., remote power panel having multiple circuits and circuit breakers), and the power-consumption nodes 110(1)-(N) can be rack PDUs. As yet another example, the power-distribution node 108 can be a UPS (e.g., uninterruptible power supply with multiple outlets), and the power-consumption nodes 110(1)-(N) can be RPPs. In any case, the power-distribution node 108 can provide electrical power to the one or more power-consumption nodes 110(1)-(N). Although only one power-distribution node 108 is depicted in FIG. 1, it is to be appreciated that this is for illustration only. In various embodiments, the data center 106 can include any suitable number of power-distribution nodes 108, with each power-distribution node 108 providing power to one or more power-consumption nodes 110(1)-(N).

In various embodiments, the power topology records 104 can be any suitable electronic records (e.g., inventory records/documentation, maintenance records/documentation, design records/documentation, and/or any other suitable records/documentation) that specify which of the one or more power-consumption nodes 110(1)-(N) is connected to which of the outlets of the power-distribution node 108 (e.g., specifying which PSU of which server is connected to which outlet of which rack PDU, specifying which rack PDU is connected to which circuit or circuit breaker of which RPP, specifying which RPP is connected to which outlet of which UPS, and/or specifying any other suitable power connections).

As mentioned above, it is possible that the power topology specified in the power topology records 104 does not match the physical/actual power topology of the data center 106. For example, the power topology records 104 can specify that the power-consumption node 110(1) is connected to a first outlet of the power-distribution node 108, but in actuality, the power-consumption node 110(1) can instead be connected to a second outlet (not shown) of the power-distribution node 108. As explained herein, the VPT system 102 can automatically detect such mismatches/inconsistencies via power state transitioning.

In various embodiments, the VPT system 102 can comprise a processor 112 (e.g., computer processing unit, microprocessor) and a computer-readable memory 114 that is operably connected to the processor 112. The memory 114 can store computer-executable instructions which, upon execution by the processor 112, can cause the processor 112 and/or other components of the VPT system 102 (e.g., measurement component 116, control component 118, verification component 120) to perform one or more acts. In various embodiments, the memory 114 can store computer-executable components (e.g., measurement component 116, control component 118, verification component 120), and the processor 112 can execute the computer-executable components.

In various instances, the power topology records 104 can specify that the a particular one of the power-consumption nodes 110(1)-(N) is connected to a particular outlet of the power-distribution node 108. As explained herein, the VPT system 102 can automatically validate this specified power connection (e.g., can determine whether the physical power topology of the data center 106 matches the planned/intended power topology that is specified in the power topology records 104). For purposes of explanation and illustration, suppose that the power topology records 104 specify that the power-consumption node 110(1) is connected to the first outlet of the power-distribution node 108 (as shown in FIG. 1). As explained herein, the VPT system 102 can automatically verify whether or not the power-consumption node 110(1) is actually/physically connected to the first outlet of the power-distribution node 108 as specified in the power topology records 104.

In various embodiments, the VPT system 102 can comprise a control component 118. In various aspects, the control component 118 can send a transition command (e.g., an electronic command) to the power-distribution node 108. In various instances, the transition command can cause the first outlet (e.g., the outlet to be validated) of the power-distribution node 108 to transition between power states (e.g., to turn from on to off, from off to on, from on to idle, from off to idle, and/or to and from any other suitable power states). In various instances, the transition command can cause the first outlet of the power-distribution node 108 to transition from any suitable power state to any other suitable power state. Exemplary and non-limiting power states can include an on-state, off-state, idle-state, standby-state, sleep-state, hibernate-state, soft-off-state, or mechanical-off-state.

In various embodiments, the VPT system 102 can comprise a measurement component 116. In various aspects, the measurement component 116 can request and/or measure a pre-transition power characteristic and a post-transition power characteristic at the power-consumption node 110(1) (e.g., the power-consumption node to be validated). In various instances, the pre-transition power characteristic can be any suitable electrical measurement taken at the power-consumption node 110(1) before the first outlet of the power-distribution node 108 transitions (e.g., power measurement (W or kVA) at the power-consumption node 110(1), voltage measurement (V) at the power-consumption node 110(1), current measurement (A) at the power-consumption node 110(1), or power state (on, off, standby, and/or any other suitable power state) of the power-consumption node 110(1)). In various instances, the post-transition power characteristic can be any suitable electrical measurement taken at the power-consumption node 110(1) after the first outlet of the power-distribution node 108 transitions (e.g., power measurement (W or kVA) at the power-consumption node 110(1), voltage measurement (V) at the power-consumption node 110(1), current measurement (A) at the power-consumption node 110(1), or power state (on, off, standby, and/or any other suitable power state) of the power-consumption node 110(1)).

In various embodiments, the VPT system 102 can comprise a verification component 120. In various aspects, the verification component 120 can compare the pre-transition power characteristic and the post-transition power characteristic in order to determine whether or not the power-consumption node 110(1) is actually/physically connected to the first outlet of the power-distribution node 108. Because the power-distribution node 108 can provide electrical power to the one or more power-consumption nodes 110(1)-(N), the transition of an outlet of the power-distribution node 108 from one power state to another power state can be expected to cause a corresponding and/or commensurate electrical response in whichever of the power-consumption nodes 110(1)-(N) is actually/physically connected to that outlet of the power-distribution node 108. In the above example, the power topology records 104 specify that the power-consumption node 110(1) is connected to the first outlet of the power-distribution node 108. If the power-consumption node 110(1) is actually/physically connected to the first outlet of the power-distribution node 108 (as shown), then a power state transition of the first outlet of the power-distribution node 108 can be expected to cause a corresponding or commensurate electrical response at the power-consumption node 110(1) (e.g., transitioning the first outlet of the power-distribution node 108 from an on-state to an off-state can be expected to cause the power, voltage, or current at the power-consumption node 110(1) to correspondingly decrease or to cause the power-consumption node 110(1) to switch to an off-state; transitioning the first outlet of the power-distribution node 108 from an off-state to an on-state can be expected to cause the power, voltage, or current at the power-consumption node 110(1) to correspondingly increase or to cause the power-consumption node 110(1) to switch to an on-state). The absence or presence of this corresponding/commensurate electrical response of the power-consumption node 110(1) can be detected by comparing the pre-transition and post-transition power characteristics. For instance, if the comparison shows that the power-consumption node 110(1) responded as would be expected if it were actually/physically connected to the first outlet of the power-distribution node 108, it can be inferred/determined that the power-consumption node 110(1) is, in fact, actually/physically connected to the first outlet of the power-distribution node 108. In such case, the specified connection in the power topology records 104 can be determined to match the physical connection in the data center 106. On the other hand, if the comparison shows that the power-consumption node 110(1) did not respond as would be expected if it were actually/physically connected to the first outlet of the power-distribution node 108, it can be inferred/determined that the power-consumption node 110(1) is not actually/physically connected to the first outlet of the power-distribution node 108. In such case, the specified connection in the power topology records 104 can be determined to not match the physical connection in the data center 106.

To help clarify such embodiments of FIG. 1, consider the following non-limiting example. Suppose that the power-distribution node 108 is a rack PDU, that the power-consumption node 110(1) is a server PSU, and that the power topology records 104 specify that the server PSU is connected to the third outlet of the rack PDU. In such case, the measurement component 116 can request and/or measure a pre-transition power characteristic (e.g., voltage measurement) at the server PSU, and the control component 118 can send a transition command instructing the rack PDU to transition its third outlet between power states (e.g., from on to off). The measurement component 116 can then request and/or measure a post-transition power characteristic (e.g., voltage measurement) at the server PSU, and the verification component 120 can compare the pre-transition and post-transition power characteristics to determine whether an expected electrical response occurred at the server PSU (e.g., lower and/or zero voltage at server PSU after third outlet of rack PDU transitioned to off-state). If so, the connection can be marked as validated. If not, the connection can be marked as invalidated.

In various embodiments, as discussed above, the power-distribution node 108 can have remotely and individually controllable outlets. In such cases, the control component 118 can send a transition command to the power-distribution node 108 to transition a desired outlet of the power-distribution node 108 between power states, and the measurement component 116 can request pre-transition and post-transition power characteristics from a desired one of the power-consumption nodes 110(1)-(N). However, in various instances, it is possible that the power-distribution node 108 does not have remotely and individually controllable outlets (e.g., while some rack PDUs have remotely and individually controllable outlets, others may not; while some RPPs have remotely and individually controllable circuits or circuit breakers, others may not; while some UPSs have remotely and individually controllable outlets, others may not). In such cases, the VPT system 102 can automatically validate the power topology of the data center 106 by transitioning a desired one of the power-consumption nodes 110(1)-(N) and measuring the response at a desired outlet of the power-distribution node 108. For instance, suppose that the power topology records 104 specify that the power-consumption node 110(1) is connected to the first outlet of the power-distribution node 108. In such case, the control component 118 can send a transition command to the power-consumption node 110(1), which can cause the power-consumption node 110(1) (and/or a remotely and individually controllable outlet of the power-consumption node 110(1)) to transition between power states. Moreover, in such case, the measurement component 116 can request and/or measure a pre-transition power characteristic and a post-transition power characteristic from the first outlet of the power-distribution node 108. Furthermore, in such case, the verification component 120 can compare the pre-transition and post-transition power characteristics to determine whether or not an expected electrical response occurred at the first outlet of the power-distribution node 108. If so, the power topology records 104 can be validated. If not, the power topology records 104 can be deemed inconsistent with the physical/actual power topology of the data center 106.

To help clarify such embodiments of FIG. 1, consider the following non-limiting example. Suppose that the power-distribution node 108 is an RPP, that the power-consumption node 110(1) is a rack PDU, and that the power topology records 104 specify that the rack PDU is connected to a fourth circuit breaker of the RPP. In such case, the measurement component 116 can request and/or measure a pre-transition power characteristic (e.g., voltage measurement) at the fourth circuit breaker of the RPP, and the control component 118 can send a transition command to the rack PDU to transition between power states (e.g., to turn all outlets of the rack PDU from on to off). The measurement component 116 can request and/or measure a post-transition power characteristic (e.g., voltage measurement) at the fourth circuit breaker of the RPP, and the verification component 120 can compare the pre-transition and post-transition power characteristics to determine whether an expected electrical response occurred at the fourth circuit breaker of the RPP (e.g., sufficiently lowered voltage). If so, the power connection can be marked as validated. If not, the power connection can be marked as invalidated.

In various embodiments, a power-consumption node and/or a power-distribution node of the data center 106 can be a multi-phase power device (e.g., a rack PDU can be a 3-phase power device with each outlet assigned to a corresponding one of the three input phases). In such cases, validation of power topology can be facilitated in a phase-by-phase manner. For example, suppose that validation is desired of a power connection between a three-phase rack PDU (e.g., the power-consumption node 110(1) can be a three-phase rack PDU with phase-A outlets, phase-B outlets, and phase-C outlets) and a particular circuit breaker of an RPP (e.g., the power-distribution node 108 can be an RPP). In various aspects, the measurement component 116 can request and/or measure a pre-transition power characteristic from the particular circuit breaker of the RPP. In various cases, the RPP can have individual electrical measurements available for each phase of each circuit breaker (e.g., power, voltage, current, and/or state measurements available for phase-A of each individual circuit breaker; power, voltage, current, and/or state measurements available for phase-B of each individual circuit breaker; and/or power, voltage, current, and/or state measurements available for phase-C of each individual circuit breaker). In such cases, the pre-transition power characteristic can be phase-based, and thus can include power, voltage, current, and/or state measurements for phase-A power of the particular circuit breaker; power, voltage, current, and/or state measurements for phase-B power of the particular circuit breaker; and/or power, voltage, current, and/or state measurements for phase-C power of the particular circuit breaker. In various instances, the control component 118 can send a transition command to the rack PDU to transition the power states of all phase-A outlets (e.g., turning off all phase-A outlets of the rack PDU while keeping on all phase-B outlets and phase-C outlets of the rack PDU, turning on all phase-A outlets of the rack PDU while keeping off all phase-B outlets and phase-C outlets of the rack PDU; and/or any other suitable transition of the phase-A outlets). In various instances, the measurement component 116 can request and/or measure a phase-based post-transition power characteristic at the circuit breaker of the RPP. In various cases, the verification component 120 can compare the pre-transition and post-transition power characteristics to determine whether the phase-A power at the circuit breaker of the RPP experienced an expected electrical change in response to the transition of the phase-A outlets of the rack PDU. If so, the power connection for the phase-A outlets can be validated. If not, the power connection for the phase-A outlets can be invalidated. In various embodiments, this procedure can be repeated for the phase-B outlets of the rack PDU and/or the phase-C outlets of the rack PDU. In this way, phase-by-phase validation of power topology can be facilitated.

Therefore, in various embodiments, the VPT system 102 can determine whether a specific power connection specified in the power topology records 104 matches the physical power topology of the data center 106. Note that, in various embodiments, such validation can occur without requiring installation of additional and/or external hardware, such as waveform/signal generators, tonal tracers, or sensors, because, in various embodiments, the power-consumption and/or power-distribution nodes of the data center 106 can already be equipped with selective power transitioning capabilities and electrical measurement capabilities (e.g., smart rack PDUs can, in some cases, have remotely and individually controllable outlets and can have built-in sensors for measuring the electrical properties at each outlet; smart server PSUs can, in some cases, have remotely controllable power states and/or workloads and can have built-in sensors for measuring the electrical properties at the server PSU; smart RPPs can, in some cases, have remotely and individually controllable circuit breakers and can have built-in sensors for measuring electrical properties at each circuit breaker). Thus, in various embodiments, the pre-transition and post-transition power characteristics can be measured by the power-consumption node itself and/or the outlet of the power-distribution node itself, as the case may be. In various other embodiments, external measurement devices/sensors can be added to the data center 106 to facilitate measuring the pre-transition and post-transition power characteristics (e.g., after-market products to instrument and/or measure power, voltage, current, and/or state of older RPPs that do not have measurement capabilities themselves). Moreover, note that such validation can, in some cases, occur during runtime while a server is serving a client (e.g., when validating a power connection between an outlet of a rack PDU and a first server PSU, the server itself can be unaffected since it can receive power from a second, redundant server PSU; since the first and second server PSUs are not validated simultaneously, the server can remain online during validation). Furthermore, note that automated validation of a power connection between the power-distribution node 108 and one of the power-consumption nodes 110(1)-(N) can be facilitated regardless of the power states and/or workloads of the remaining power-consumptions nodes 110(1)-(N) (e.g., validation of a power connection between an outlet of a rack PDU and a server PSU can be facilitated regardless of the power states and/or workloads of other server PSUs that are attached to other outlets of the rack PDU).

Figure 2:
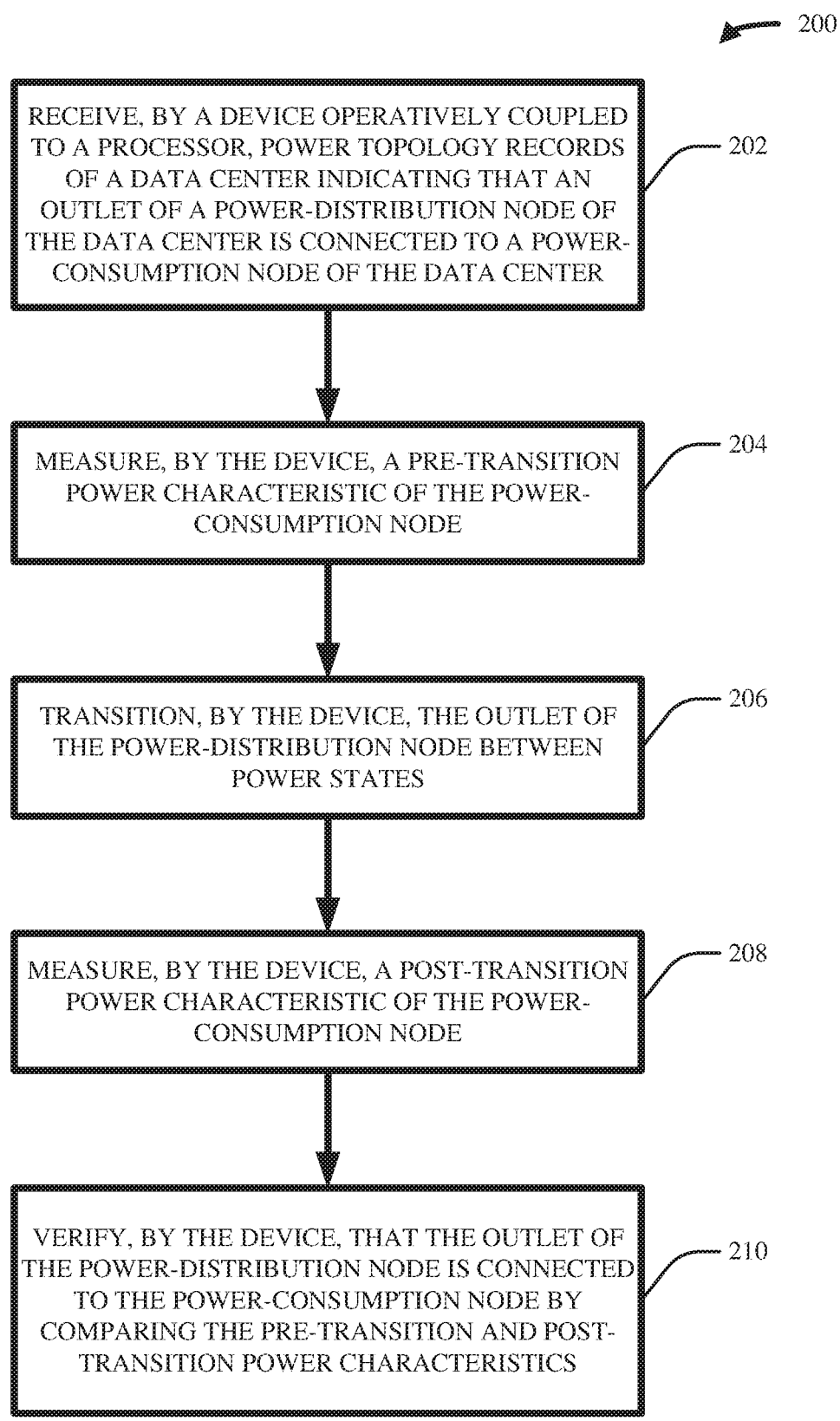
FIG. 2 illustrates a high-level flow diagram of an example, non-limiting computer-implemented method that facilitates automated validation of power topology via power state transitioning in accordance with one or more embodiments described herein.

FIG. 2 illustrates a high-level flow diagram of an example, non-limiting computer-implemented method 200 that can facilitate automated validation of power topology via power state transitioning in accordance with one or more embodiments described herein. In various embodiments, the computer-implemented method 200 can be facilitated by the system 100.

In various embodiments, act 202 can include receiving, by a device operatively coupled to a processor, power topology records of a data center indicating that an outlet of a power-distribution node of the data center is connected to a power-consumption node of the data center. In various aspects, act 204 can include measuring, by the device, a pre-transition power characteristic of the power-consumption node. In various instances, act 206 can include, transitioning, by the device, the outlet of the power-distribution node between power states. In various embodiments, act 208 can include measuring, by the device, a post-transition power characteristic of the power-consumption node. In various aspects, act 210 can include verifying, by the device, that the outlet of the power-distribution node is connected to the power-consumption node by comparing the pre-transition and post-transition power characteristics.

Figure 3:
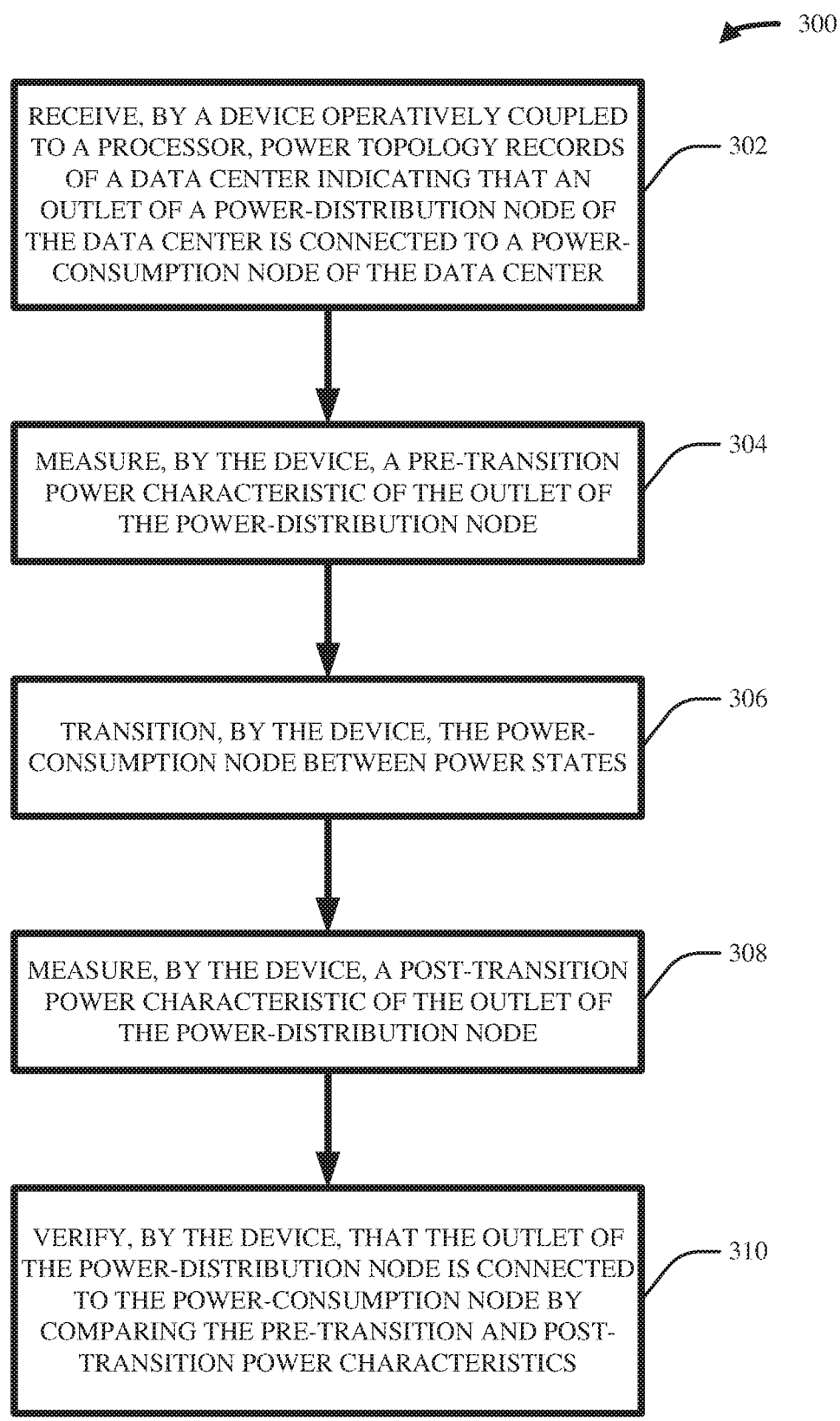
FIG. 3 illustrates a high-level flow diagram of an example, non-limiting computer-implemented method that facilitates automated validation of power topology via power state transitioning in accordance with one or more embodiments described herein.

FIG. 3 illustrates a high-level flow diagram of an example, non-limiting computer-implemented method 300 that can facilitate automated validation of power topology via power state transitioning in accordance with one or more embodiments described herein. In various embodiments, the computer-implemented method 300 can be facilitated by the system 100.

In various embodiments, act 302 can include receiving, by a device operatively coupled to a processor, power topology records of a data center indicating that an outlet of a power-distribution node of the data center is connected to a power-consumption node of the data center. In various aspects, act 304 can include measuring, by the device, a pre-transition power characteristic of the outlet of the power-distribution node. In various instances, act 306 can include transitioning, by the device, the power-consumption node between power states. In various embodiments, act 308 can include measuring, by the device, a post-transition power characteristic of the outlet of the power-distribution node. In various aspects, act 310 can include verifying, by the device, that the outlet of the power-distribution node is connected to the power-consumption node by comparing the pre-transition and post-transition power characteristics.

Figure 4:
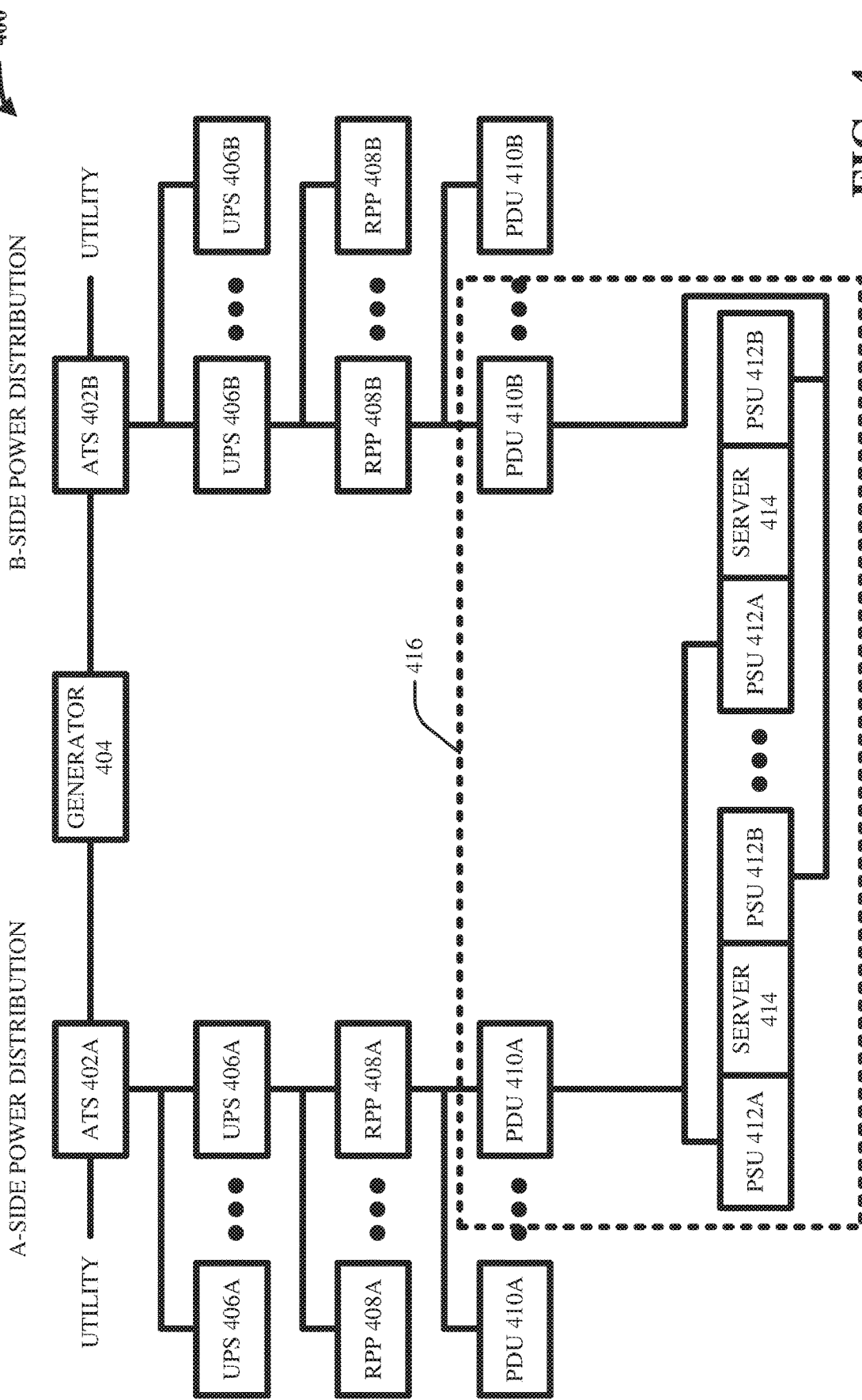
FIG. 4 illustrates a block diagram of an example, non-limiting power topology of a data center which can be automatically validated via power state transitioning by one or more embodiments described herein.

FIG. 4 illustrates a block diagram of an example, non-limiting power topology of a data center which can be automatically validated via power state transitioning by one or more embodiments described herein. As shown, a data center can have two or more building feeds (e.g., A-side power distribution, B-side power distribution) that can provide power redundancy (e.g., if one building feed fails, the data center can receive power from the other and so can avoid down time). As shown, the data center can include a generator 404 to prevent down time in the unlikely event that both the A-side and B-side building feeds fail. As shown, the A-side power distribution can include an automatic transfer switch (ATS 402A) that can receive power from a utility and/or from the generator 404. In various cases, the ATS 402A can provide power to one or more UPSs 406A (e.g., uninterruptible power supplies). In various aspects, each UPS 406A can provide power (e.g., 480 V, 400/230 V, 1150 kVA, 3-phase 225 A) to one or more RPPs 408A (e.g., remote power panels). In various instances, each RPP 408A can provide power (e.g., 3-phase 30 A) to one or more PDUs 410A (e.g., rack power distribution units). In various embodiments, each PDU 410A can provide power (e.g., 1-phase) to one or more server PSUs 412A (e.g., server power supply units). As shown, the B-side power distribution can mirror the A-side power distribution. In various instances, as shown, a rack 416 in a data center can house/support one or more servers 414. As shown, in various aspects, each server 414 can have two power supply units (e.g., a PSU 412A that receives power from the A-side power distribution and a PSU 412B that receives power from the B-side power distribution). The use of two PSUs that are on separate building feeds can provide power redundancy for the servers 414. As mentioned above, various embodiments of the invention can automatically validate this power topology via power state transitioning, without requiring installation of additional and/or external equipment, sensors, or signal generators.

Figure 5:
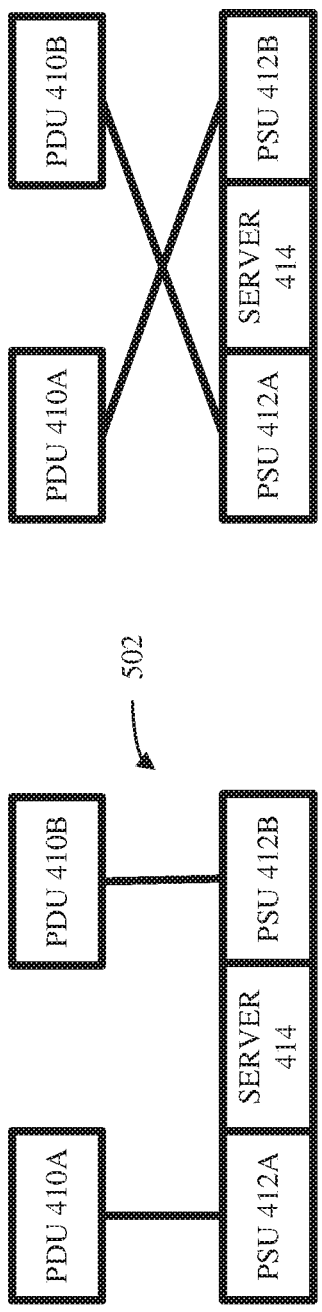
FIG. 5 illustrates block diagrams of example, non-limiting, actual power topologies as compared to an example, non-limiting, planned/intended power topology, in accordance with one or more embodiments described herein.
Figure 5:
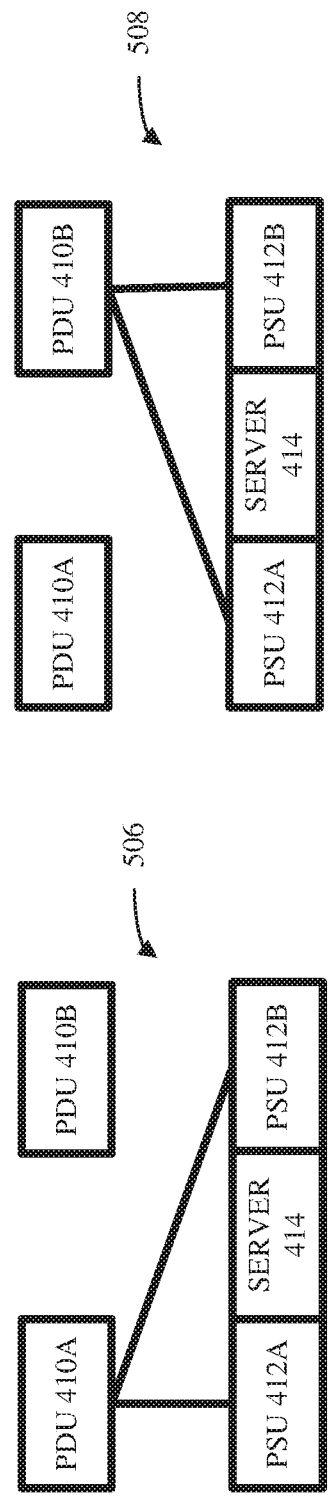

FIG. 5 illustrates block diagrams of example, non-limiting, actual power topologies as compared to an example, non-limiting, planned/intended power topology, in accordance with one or more embodiments described herein. In various instances, diagram 502 can depict a planned/intended power topology specified in power topology records. As shown, the server 414 can have redundant PSUs (e.g., PSU 412A and PSU 412B), and the records can specify that PSU 412A is connected to an outlet of PDU 410A while PSU 412B is connected to an outlet of PDU 410B. Diagrams 504-508 illustrate some exemplary, non-limiting ways in which the actual power topology can differ from the specified power topology in the records. As shown in diagram 504, it is possible that the PSU 412A is actually mistakenly connected to an outlet of the PDU 410B and that the PSU 412B is actually mistakenly connected to an outlet of the PDU 410A. As shown in diagram 506, it is possible that the PSU 412A is correctly connected to an outlet of the PDU 410A but that the PSU 412B is mistakenly connected to a different outlet of the PDU 410A. As shown in diagram 508, it is possible that the PSU 412B is correctly connected to an outlet of the PDU 410B but that the PSU 412A is mistakenly connected to a different outlet of the PDU 410B. Other types of mis-wirings can be possible. In various cases, such mis-wirings can cause power faults which can put the server 414 at risk. As explained herein, various embodiments of the invention can automatically detect such mis-wirings via power state transitioning, which can help to prevent such power faults.

Figure 6:
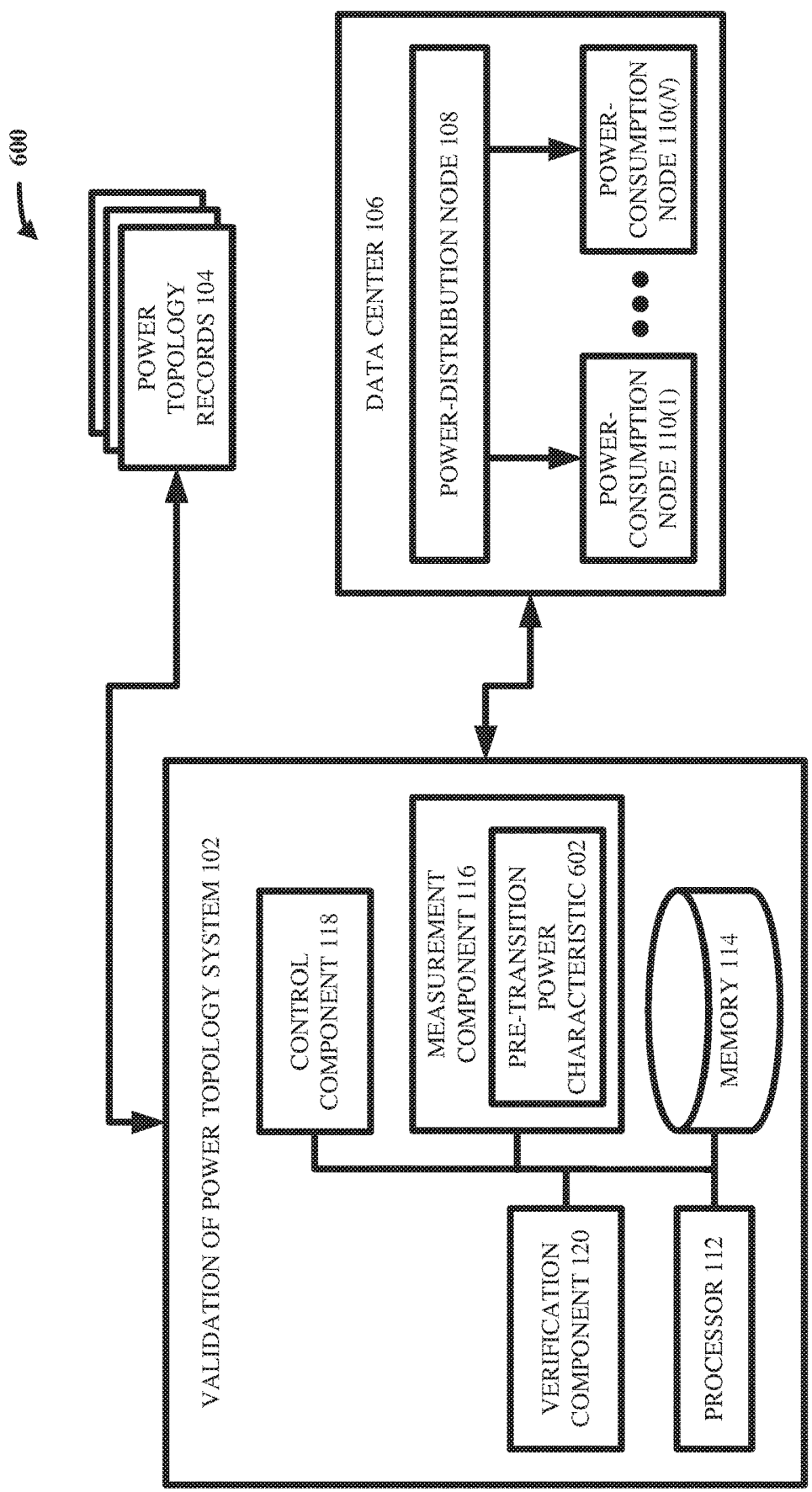
FIG. 6 illustrates a block diagram of an example, non-limiting system including a pre-transition power characteristic that facilitates automated validation of power topology via power state transitioning in accordance with one or more embodiments described herein.

FIG. 6 illustrates a block diagram of an example, non-limiting system 600 including a pre-transition power characteristic that can facilitate automated validation of power topology via power state transitioning in accordance with one or more embodiments described herein. As shown, the system 600 can, in various embodiments, comprise the same components as the system 100, and can further comprise a pre-transition power characteristic 602.

As mentioned above, the measurement component 116 can request and/or measure the pre-transition power characteristic 602 at and/or from one of the power-consumption nodes 110(1)-(N), depending on the specified power connection that is to be validated. For instance, if a specified connection between an N-th outlet of the power-distribution node 108 and the power-consumption node 110(N) is to be validated, the measurement component 116 can request the pre-transition power characteristic 602 from the power-consumption node 110(N) (e.g., since the power-consumption node 110(N) can already have built-in power, voltage, current, and/or state sensors, the power-consumption node 110(N) can take/record the requested measurement and transmit it to the measurement component 116). In various instances, the pre-transition power characteristic 602 can comprise at least one of a power state of the power-consumption node 110(N) (e.g., on, off, standby, and/or any other suitable power state), a power measurement (W or kVA) at the power-consumption node 110(N), a voltage measurement (V) at the power-consumption node 110(N), a current measurement (A) at the power-consumption node 110(N), and/or any other suitable electrical measurement.

Figure 7:
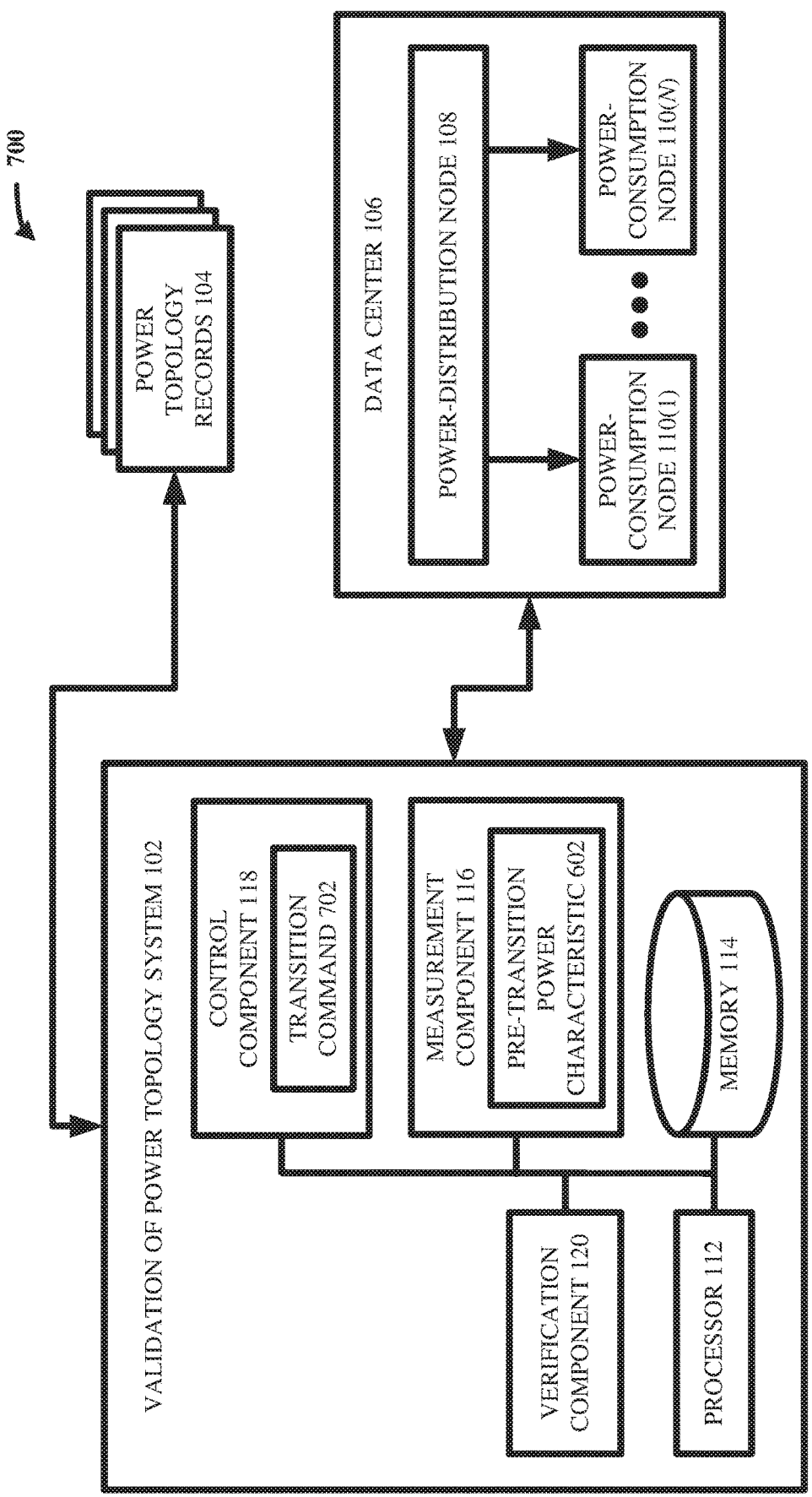
FIG. 7 illustrates a block diagram of an example, non-limiting system including a transition command that facilitates automated validation of power topology via power state transitioning in accordance with one or more embodiments described herein.

FIG. 7 illustrates a block diagram of an example, non-limiting system 700 including a transition command that can facilitate automated validation of power topology via power state transitioning in accordance with one or more embodiments described herein. As shown, the system 700 can, in various embodiments, comprise the same components as the system 600, and can further comprise a transition command 702.

As mentioned above, the control component 118 can send the transition command 702 to the power-distribution node 108, which can cause a desired outlet of the power-distribution node 108 to transition between power states, depending on the specified power connection that is to be validated. To continue the above example where the specified connection between the N-th outlet of the power-distribution node 108 and the power-consumption node 110(N) is to be validated and where the pre-transition power characteristic 602 was requested from the power-consumption node 110(N), the control component 118 can send the transition command 702 to the power-distribution node 108 to cause the N-th outlet to transition between power states.

Figure 8:
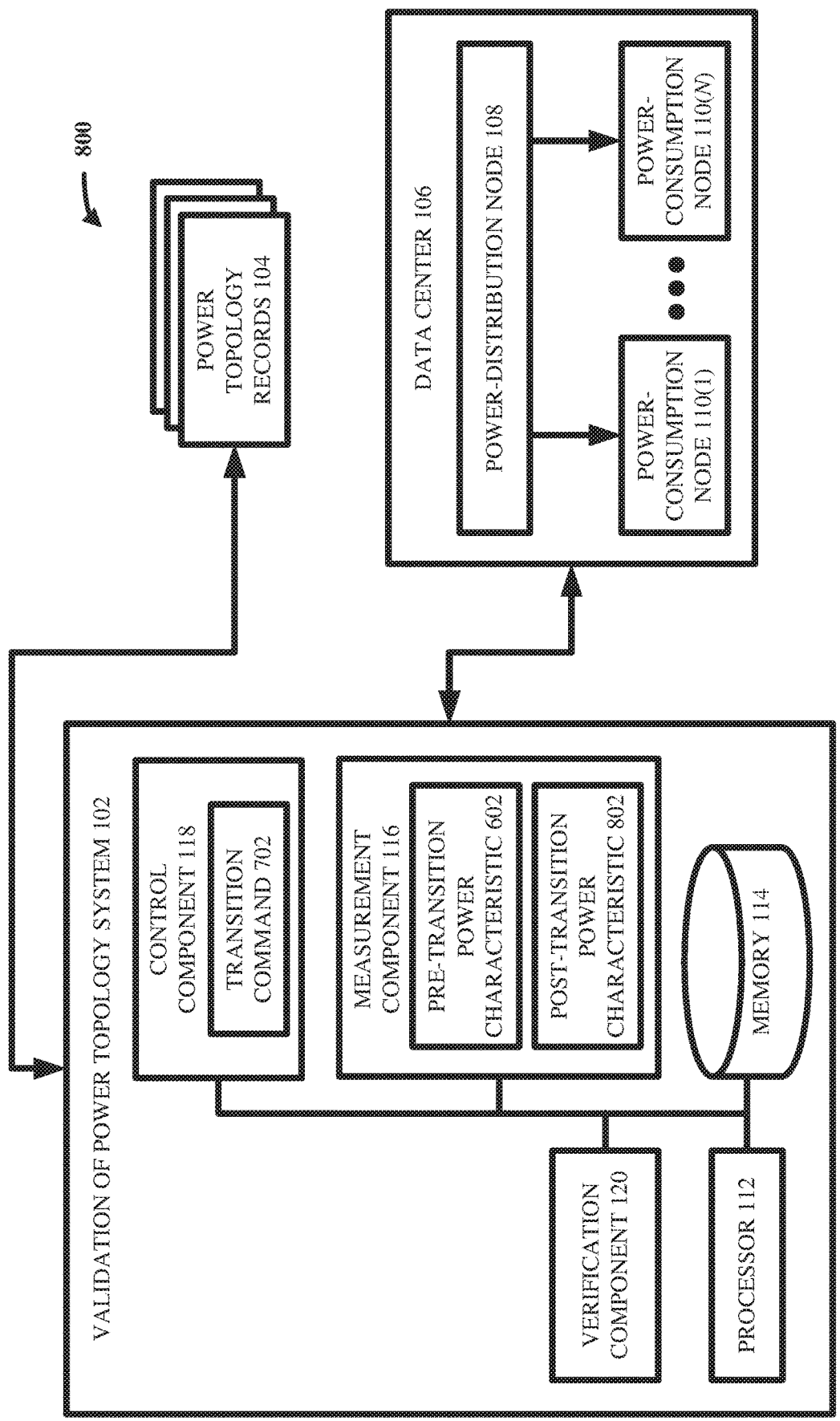
FIG. 8 illustrates a block diagram of an example, non-limiting system including a post-transition power characteristic that facilitates automated validation of power topology via power state transitioning in accordance with one or more embodiments described herein.

FIG. 8 illustrates a block diagram of an example, non-limiting system 800 including a post-transition power characteristic that can facilitate automated validation of power topology via power state transitioning in accordance with one or more embodiments described herein. As shown, the system 800 can, in various embodiments, comprise the same components as the system 700, and can further comprise a post-transition power characteristic 802.

As mentioned above, the measurement component 116 can request and/or measure the post-transition power characteristic 802 from and/or at one of the power-consumption nodes 110(1)-(N) after the desired outlet of the power-distribution node 108 transitions between power states, depending on the specified power connection that is to be validated. To continue the above example where the specified connection between the N-th outlet of the power-distribution node 108 and the power-consumption node 110(N) is to be validated and where the transition command 702 was sent to the power-distribution node 108 to transition the N-th outlet between power states, the measurement component 116 can request the post-transition power characteristic 802 from the power-consumption node 110(N). In various instances, the post-transition power characteristic 802 can comprise at least one of a power state of the power-consumption node 110(N) (e.g., on, off, standby, and/or any other suitable power state), a power measurement (W or kVA) at the power-consumption node 110(N), a voltage measurement (V) at the power-consumption node 110(N), a current measurement (A) at the power-consumption node 110(N), and/or any other suitable electrical measurement.

Figure 9:
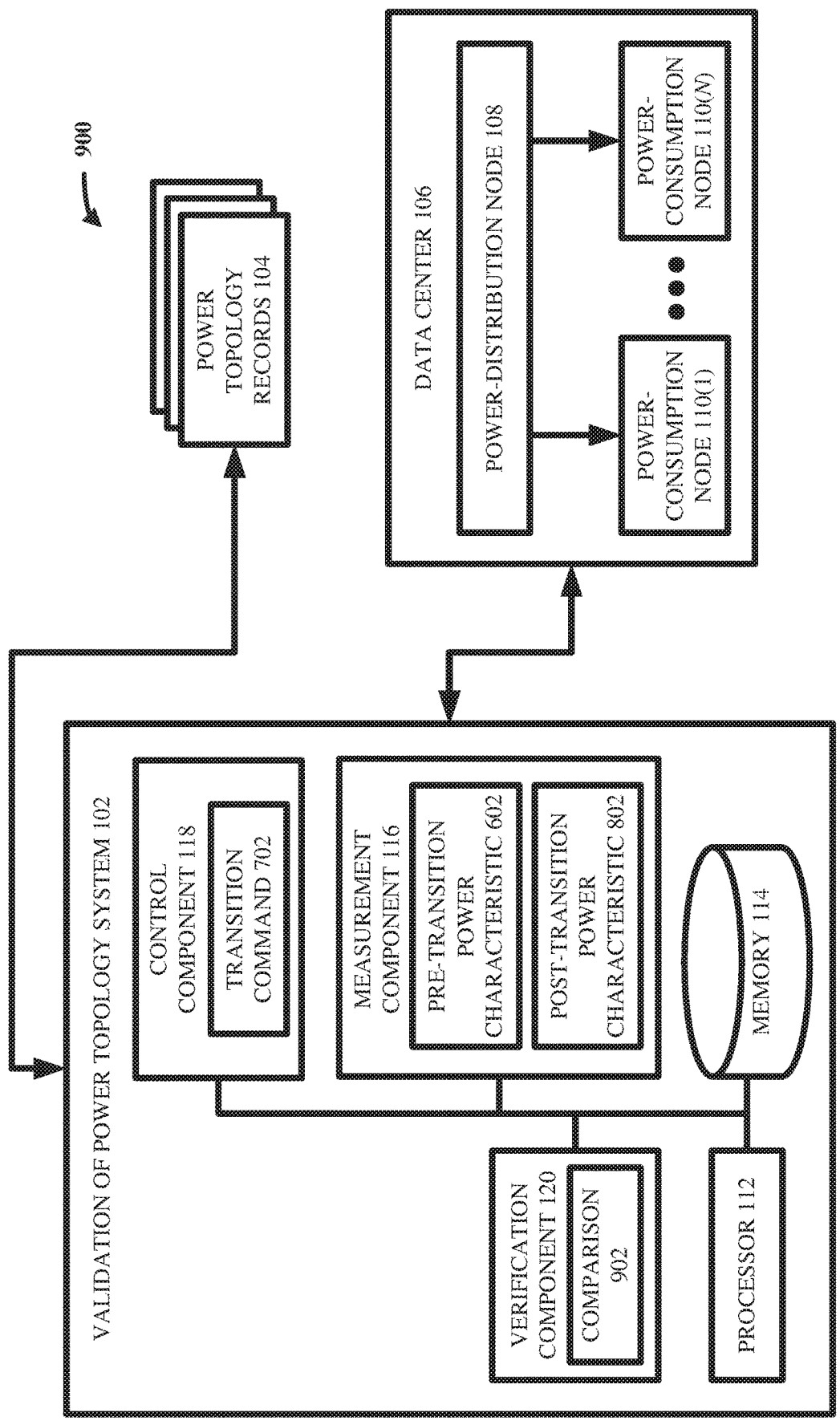
FIG. 9 illustrates a block diagram of an example, non-limiting system including a comparison of power characteristics that facilitates automated validation of power topology via power state transitioning in accordance with one or more embodiments described herein.

FIG. 9 illustrates a block diagram of an example, non-limiting system 900 including a comparison of power characteristics that can facilitate automated validation of power topology via power state transitioning in accordance with one or more embodiments described herein. As shown, the system 900 can, in various embodiments, comprise the same components as the system 800, and can further comprise a comparison 902.

As mentioned above, the verification component 120 can compare (e.g., via any suitable mathematical and/or statistical techniques) the pre-transition power characteristic 602 and the post-transition power characteristic 802, thereby yielding the comparison 902. In various aspects, the comparison 902 can be used to validate the specified power connection. To continue the above example where the N-th outlet of the power-distribution node 108 transitioned between power states and the pre-transition power characteristic 602 and the post-transition power characteristic 802 were requested from the power-consumption node 110(N), the comparison 902 can indicate whether an expected, corresponding, and/or commensurate electrical reaction occurred at the power-consumption node 110(N) in response to the transition of the N-th outlet of the power-distribution node 108. If so, the power connection can be marked as validated. If not, the power connection can be marked as invalidated.

As mentioned above, in some embodiments, the VPT system 102 can transition a power state of a desired one of the power-consumption nodes 110(1)-(N) and measure a corresponding or commensurate electrical response at a desired outlet of the power-distribution node 108 (e.g., because the power-distribution node 108 can, in some cases, be configured with built-in sensors to monitor power, voltage, current, and/or state of its individual outlets). Suppose that validation is sought of a specified power connection between the N-th outlet of the power-distribution node 108 and the power-consumption node 110(N). In such case, the control component 118 can send the transition command 702 to the power-consumption node 110(N), and the measurement component 116 can request the pre-transition power characteristic 602 and the post-transition power characteristic 802 from the N-th outlet of the power-distribution node 108. The verification component 120 can then generate the comparison 902 in order to determine whether an expected electrical reaction occurred at the N-th outlet of the power-distribution node 108 in response to the transition at the power-consumption node 110(N). If so, the power connection can be marked as validated. If not, the power connection can be marked as invalidated.

Figure 10:
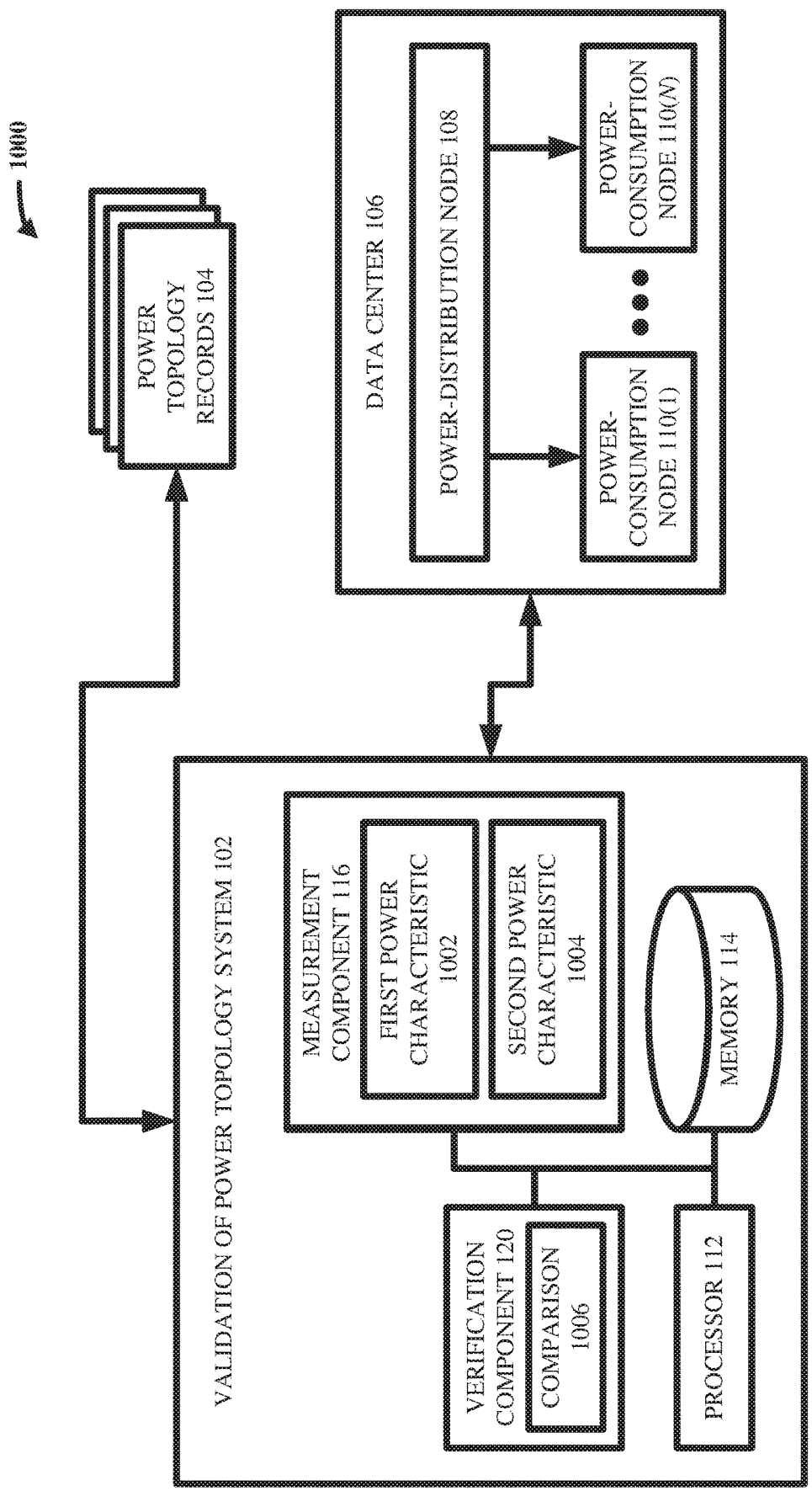
FIG. 10 illustrates a block diagram of an example, non-limiting system that facilitates automated validation of power topology via power state transitioning in accordance with one or more embodiments described herein.

FIG. 10 illustrates a block diagram of an example, non-limiting system 1000 that can facilitate automated validation of power topology via power state transitioning in accordance with one or more embodiments described herein.

In various instances, FIG. 10 can depict various alternative embodiments of the invention that can verify power connections without requiring power state transitions. Suppose that a specified power connection between the power-consumption node 110(1) and the first outlet of the power-distribution node 108 is to be validated. In such case, the measurement component 116 can request a first power characteristic 1002 from the power-consumption node 110(1) (e.g., power state of the power-consumption node 110(1), power measurement (W or kVA) at the power-consumption node 110(1), voltage measurement (V) at the power-consumption node 110(1), current measurement (A) at the power-consumption node 110(1), and/or any other suitable electrical measurement). Moreover, the measurement component 116 can request a second power characteristic 1004 from the first outlet of the power-distribution node 108 (e.g., power state of the first outlet of the power-distribution node 108, power measurement (W or kVA) at the first outlet of the power-distribution node 108, voltage measurement (V) at the first outlet of the power-distribution node 108, current measurement (A) at the first outlet of the power-distribution node 108, and/or any other suitable electrical measurement). In various embodiments, the first power characteristic 1002 and the second power characteristic 1004 can be measured during a same time period. The verification component 120 can then compare the first power characteristic 1002 and the second power characteristic 1004, thereby generating a comparison 1006. In various aspects, the comparison 1006 can indicate whether or not the power-consumption node 110(1) is actually/physically connected to the first outlet of the power-distribution node 108. For example, if the first power characteristic 1002 and the second power characteristic 1004 are substantially the same and/or are within measurement error (e.g., 1% to 2% difference), then the verification component 120 can determine that the specified power connection is validated. If, on the other hand, the comparison 1006 indicates a greater and/or statistically significant percentage difference (e.g., greater than 2%), then the verification component 120 can determine that the specified power connection is not validated. In various aspects, the measurement component 116 and the verification component 120 can repeat these measurements and comparisons multiple times to attain a certain confidence level and thereby reduce chance of mistaken validation or mistaken invalidation. In various aspects, the embodiments depicted in FIG. 10 can be useful for validating power connections between a rack PDU and a circuit breaker of an RPP.

Figure 11:
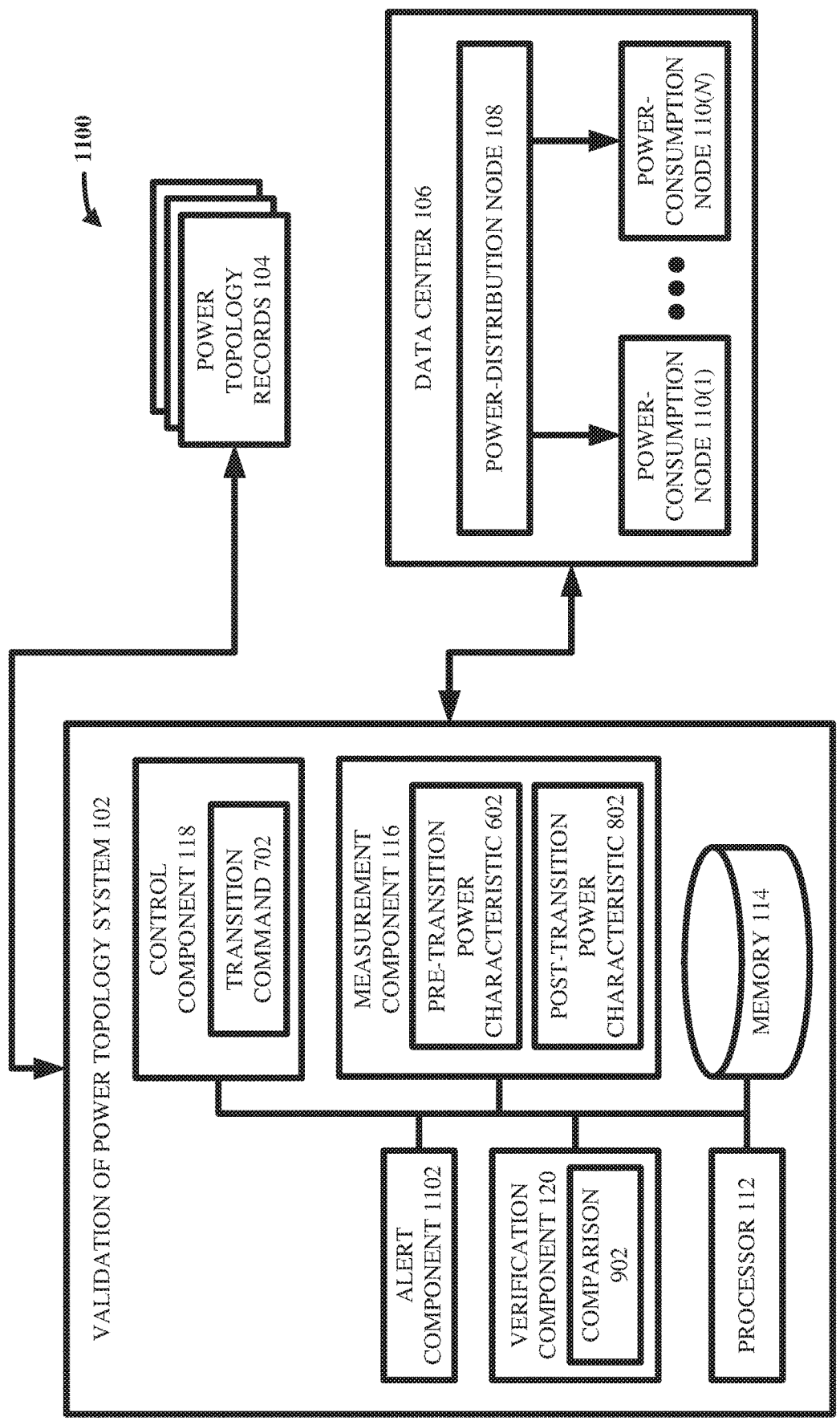
FIG. 11 illustrates a block diagram of an example, non-limiting system including an alert component that facilitates automated validation of power topology via power state transitioning in accordance with one or more embodiments described herein.

FIG. 11 illustrates a block diagram of an example, non-limiting system including an alert component that can facilitate automated validation of power topology via power state transitioning in accordance with one or more embodiments described herein. As shown, the system 1100 can, in various embodiments, comprise the same components as the system 900, and can further comprise an alert component 1102.

In various embodiments, the alert component 1102 can transmit a success message and/or an alert message to an operator of the data center, based on the verification component 120. For example, if the verification component 120 successfully verifies that the specified power connection in the power topology records 104 matches the physical power topology of the data center 106, the alert component 1102 can transmit (e.g., via any suitable wired and/or wireless electronic connection) a success message to an operator, indicating that the specified power connection was validated. As another example, if the verification component 120 fails to verify that the specified power connection in the power topology records 104 matches the physical power topology of the data center 106, the alert component 1102 can transmit an alert message to an operator, indicating that the specified power connection was not validated. In various instances, if verification fails, the alert component 1102 can automatically contact, book, order, schedule, purchase, rent, and/or otherwise procure (e.g., via any suitable wired and/or wireless electronic connection) a maintenance provider for the data center 106 and inform such maintenance provider that the specified power connection was not validated. In various aspects, success messages and/or alert messages can be transmitted over wired and/or wireless connections to any suitable computing and/or mobile device of the operator or of a maintenance or service vendor/provider.

Figure 12:
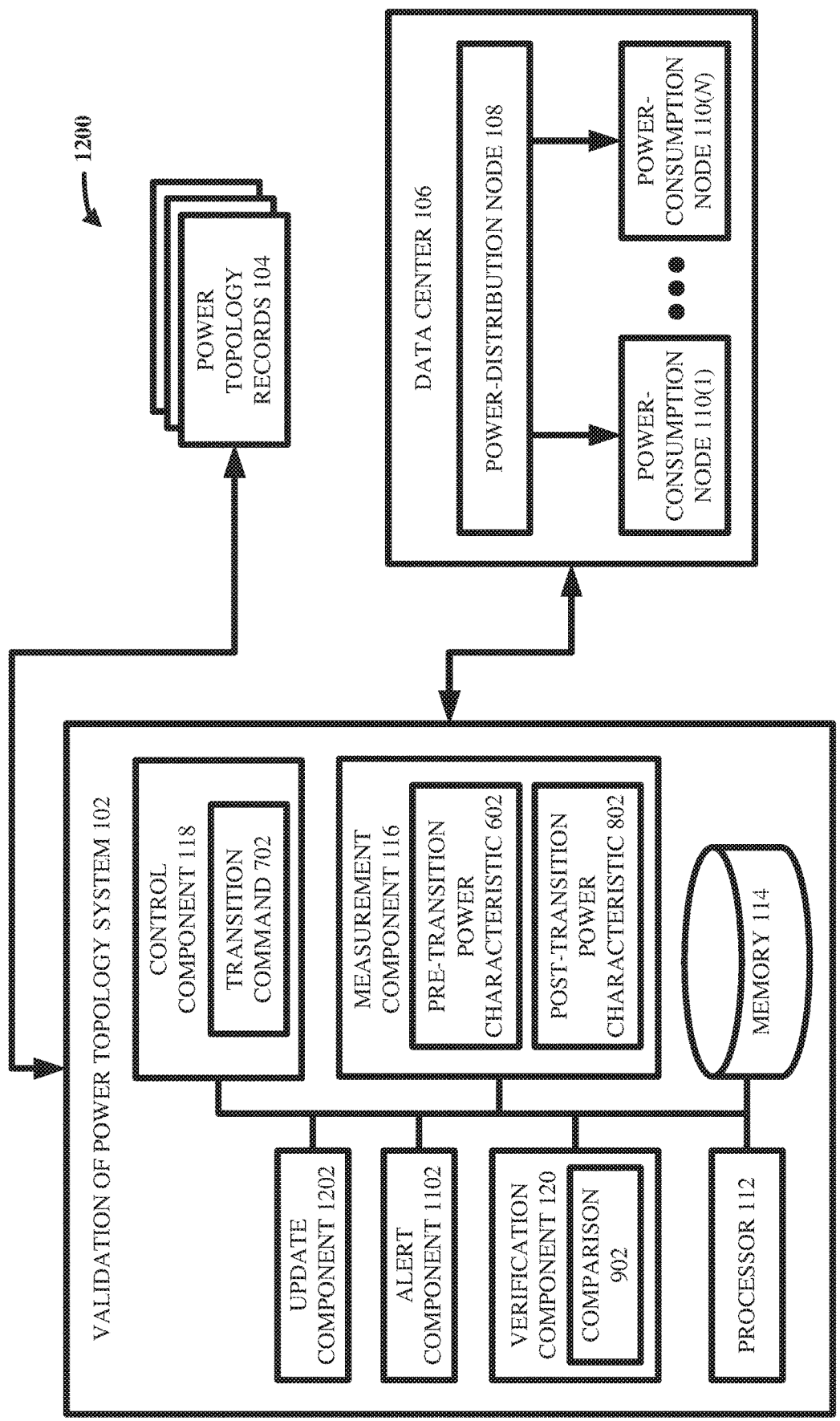
FIG. 12 illustrates a block diagram of an example, non-limiting system including an update component that facilitates automated validation of power topology via power state transitioning in accordance with one or more embodiments described herein.

FIG. 12 illustrates a block diagram of an example, non-limiting system 1200 including an update component that can facilitate automated validation of power topology via power state transitioning in accordance with one or more embodiments described herein. As shown, the system 1200 can, in various embodiments, comprise the same components as the system 1100, and can further comprise an update component 1202.

In various embodiments, the update component 1202 can update and/or edit the power topology records 104 based on verification of a specified power connection by the verification component 120. For example, if the verification component 120 successfully verifies a specified power connection in the power topology records 104, the update component 1202 can generate (e.g., via a word processor and/or any suitable word processing program) an annotation in the power topology records 104 pertaining to that specified power connection, wherein the annotation can indicate that the specified power connection was successfully validated. In some cases, the annotation can include a date/time of validation. As another example, if the verification component 120 fails to verify a specified power connection in the power topology records 104, the update component 1202 can generate an annotation in the power topology records 104 pertaining to that specified power connection, wherein the annotation can indicate that the specified power connection was not successfully validated. In some cases, the annotation can include a date/time of invalidation. In some embodiments, the update component 1202 can delete the specified power connection from the power topology records 104 if verification fails.

In various aspects, the alert component 1102 and/or the update component 1202 can be incorporated into embodiments of the invention depicted in FIG. 10.

Figure 13:
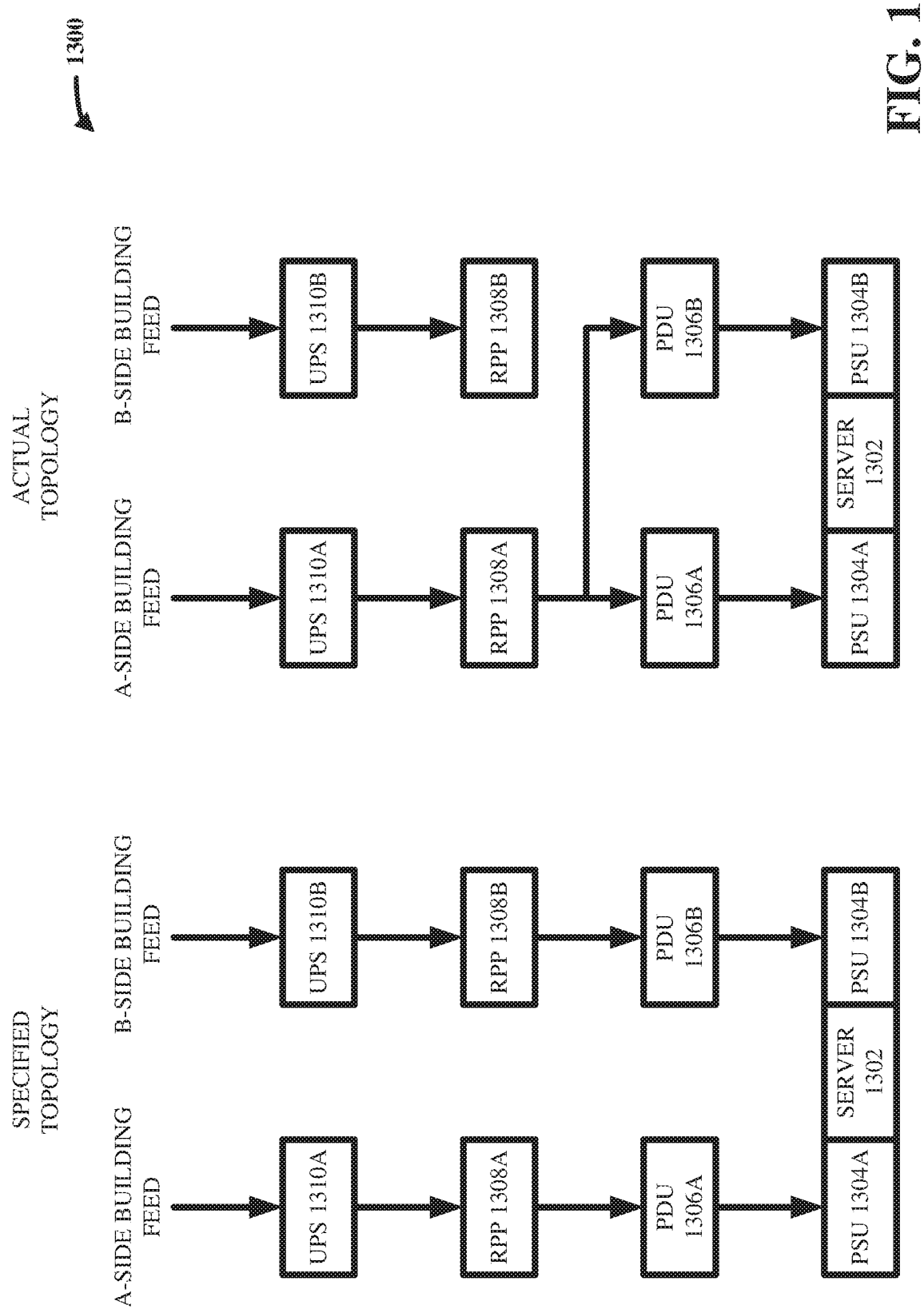
FIG. 13 illustrates diagrams of an example, non-limiting, specified power topology of a redundantly powered server as compared to an example, non-limiting, actual power topology of the server, in accordance with one or more embodiments described herein.

FIG. 13 illustrates diagrams of an example, non-limiting, specified power topology of a redundantly powered server as compared to an example, non-limiting, actual power topology of the server, in accordance with one or more embodiments described herein.

As mentioned above, various embodiments of the invention can facilitate validation of redundantly powered equipment in a data center (e.g., a server that has redundant PSUs). As shown, a data center can have a server 1302 that is specified in power topology records of the data center as receiving power from a PSU 1304A and a PSU 1304B. In various instances, the PSU 1304A can be specified as receiving power from an A-side building feed (e.g., PSU 1304A specified as receiving power from a particular outlet of PDU 1306A, which is specified as receiving power from a particular circuit breaker of RPP 1308A, which is specified as receiving power from a particular outlet of UPS 1310A, which is specified as receiving power from utility A). Similarly, the PSU 1304B can be specified as receiving power from a B-side building feed (e.g., PSU 1304B specified as receiving power from a particular outlet of PDU 1306B, which is specified as receiving power from a particular circuit breaker of RPP 1308B, which is specified as receiving power from a particular outlet of UPS 1310B, which is specified as receiving power from utility B).

As shown, it is possible that the physical/actual power topology of the data center does not match what is specified in the power topology records. For example, FIG. 13 depicts PDU 1306A as being actually connected to a circuit breaker of RPP 1308A, and depicts PDU 1306B as being actually connected to a second circuit breaker of RPP 1308A. This means that the server 1302 is actually receiving all its power from only the A-side building feed. Thus, if the A-side building feed fails, the server 1302 will also fail since it is not actually connected to the B-side power feed. As explained herein, embodiments of the invention can automatically detect such mis-wirings of redundantly powered equipment in a data center.

In various aspects, embodiments of the invention can examine/analyze (e.g., in some cases, via any suitable artificial intelligence and/or machine learning techniques) the power topology records (e.g., 104) to determine that the PSU 1304A is specified as being connected to the PDU 1306A, and to determine that the PSU 1304B is specified as being connected to the PDU 1306B. Note that if the power topology records indicate that the PSU 1304A and the PSU 1304B are connected to the same rack PDU, embodiments of the invention (e.g., via the alert component 1102) can generate an alert message to that effect without validating those power connections, since such specified power connections are clearly erroneous. After all, if both redundant PSUs are specified as being connected to the same rack PDU, then the records certainly do not specify that the redundant PSUs are on separate building feeds, thus meriting an alert message. In the example shown, the PDU 1306A is separate from the PDU 1306B, and so further validation can be pursued.

Various embodiments of the invention can automatically validate via power state transitioning whether the PSU 1304A is actually connected to the PDU 1306A, as described herein, and can then automatically validate via power state transitioning whether the PSU 1304B is actually connected to the PDU 1306B, as described herein. If either of these power connections is not validated, embodiments of the invention can raise an alert to an operator indicating that the server 1302 is not properly redundantly powered, and embodiments of the invention need not continue validating the power topology records. On the other hand, if the both of these power connections are validated, embodiments of the invention can proceed as follows.

In various aspects, embodiments of the invention can move up a level in the power topology records so as to determine the specified connections between the PDUs and the RPPs. That is, embodiments of the invention can examine/analyze the power topology records to determine that the PDU 1306A is specified as being connected to the RPP 1308A, and to determine that the PDU 1306B is specified as being connected to the RPP 1308B. Note that if the power topology records indicate that the PDU 1306A and the PDU 1306B are connected to the same RPP, embodiments of the invention can generate an alert message to that effect without validating those power connections, since such a specification is clearly erroneous (e.g., if both rack PDUs are specified as being connected to the same RPP, then the records certainly do not specify that they are on separate building feeds, thus meriting an alert message). In the example shown, the RPP 1308A is separate from the RPP 1308B, and so further validation can be pursued.

Various embodiments of the invention can automatically validate via power state transitioning whether the PDU 1306A is actually connected to the RPP 1308A, as described herein, and can then automatically validate via power state transitioning whether the PDU 1306B is actually connected to the RPP 1308B, as described herein. If either of these power connections is not validated, embodiments of the invention can raise an alert to an operator indicating that the server 1302 is not properly redundantly powered, and embodiments of the invention need not continue validating the power topology records. Here, embodiments of the invention can detect that the PDU 1306B is not actually connected to the RPP 1308B as depicted in FIG. 13 (e.g., by transitioning the specified circuit breaker of the RPP 1308B between power states and measuring no corresponding/commensurate response at the PDU 1306B, and/or by transitioning the PDU 1306B between power states and measuring no commensurate/corresponding response at the specified circuit breaker of the RPP). So, embodiments of the invention can raise an appropriate alert to the operator. If both of these power connections were instead validated (e.g., PDU 1306A actually connected to RPP 1308A, and PDU 1306B actually connected to RPP 1308B (not shown)), embodiments of the invention could again move up a level in the power topology records to determine and/or validate the specified power connections (e.g., determining and validating the specified power connections between the RPPs and the UPSs). In this way, automated validation of redundant power topologies of a data center via power state transitioning can be facilitated, without requiring installation of additional and/or external hardware that is not already present in the data center.

Note that, in various aspects, the server 1302 need not be taken off-line to facilitate the described validation of redundant power topology via power state transitioning. This is because, in various embodiments, the power validation techniques described herein can be implemented so as to affect only one PSU of the server 1302 at a time. For instance, causing one outlet of the PDU 1306A to transition between power states can affect at most only one of the PSU 1304A and the PSU 1304B, even if both are actually connected to the same rack PDU (e.g., because the PSU 1304A and the PSU 1304B can be assumed to not share a single outlet in the rack PDU). If the power connections between the PSUs and the rack PDUs were not both validated, embodiments of the invention can generate an appropriate alert message and need not continue examining/validating the power topology records. On the other hand, if the power connections between the PSUs and the PDUs are both validated, embodiments of the invention can move up a level in the power topology records to determine and/or validate the specified power connections between the rack PDUs and the RPPs.

At this point in the validation, it is known that the PSU 1304A is actually connected to the PDU 1306A as specified and that the PSU 1304B is actually connected to the PDU 1306B as specified. So, transitioning a circuit breaker of the RPP 1308A between power states can affect at most only one of the PDU 1306A and the PDU 1306B, and therefore can affect at most only one of the PSU 1304A and the PSU 1304B (e.g., because the PDU 1306A and the PDU 1306B can be assumed to not share a single circuit breaker of an RPP). If the power connections between the rack PDUs and the RPPs are not both validated, embodiments of the invention can generate an appropriate alert message and need not continue examining/validating the power topology records. On the other hand, if the power connections between the rack PDUs and the RPPs are both validated, embodiments of the invention can move up a level in the power topology records to determine and/or validate the specified power connections between the RPPs and the UPSs.

In various aspects, this verification process can facilitate automatically determining whether or not the redundant power topology specified in the data center records for the server 1302 matches the actual power topology of the server 1302. Moreover, such automated validation of power topology can be performed without requiring the server 1302 to power down since at least one server PSU can remain online during validation, as described above. Thus, various embodiments of the invention can facilitate validation of power topology simultaneously as the server being validated serves clients.

Figure 14:
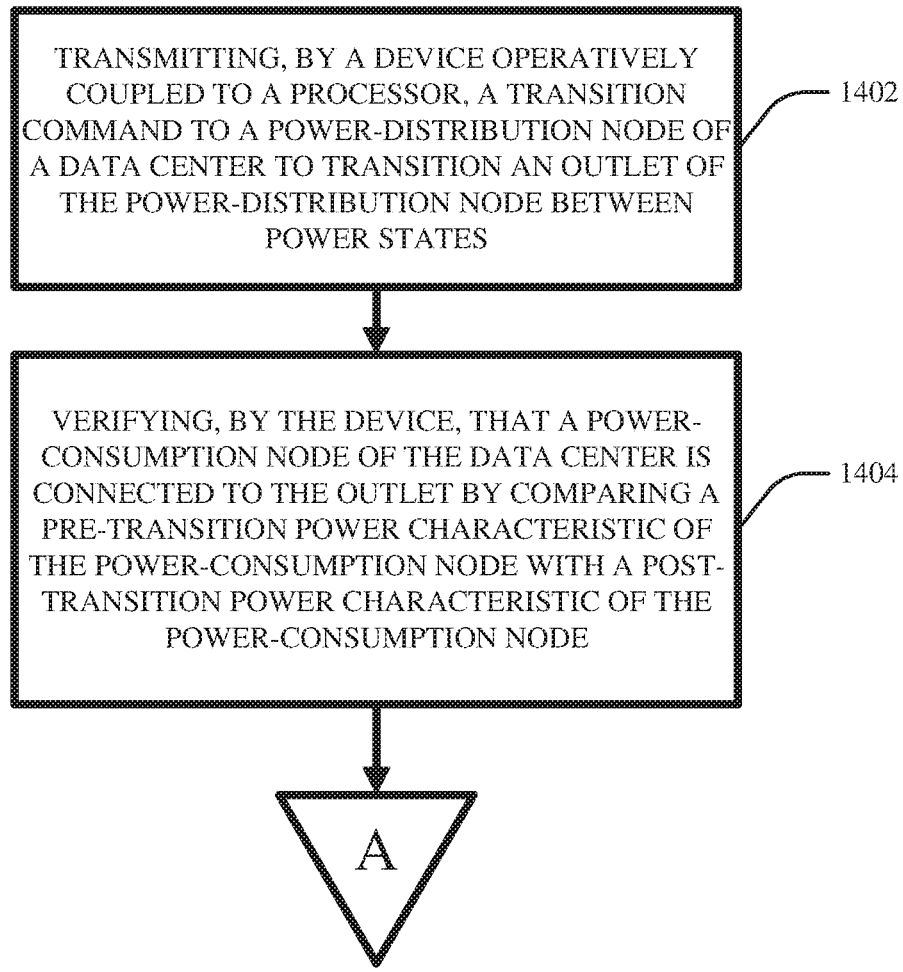
FIG. 14 illustrates a flow diagram of an example, non-limiting computer-implemented method that facilitates automated validation of power topology via power state transitioning in accordance with one or more embodiments described herein.

FIG. 14 illustrates a flow diagram of an example, non-limiting computer-implemented method 1400 that can facilitate automated validation of power topology via power state transitioning in accordance with one or more embodiments described herein.

In various embodiments, act 1402 can include transmitting, by a device operatively coupled to a processor (e.g., control component 118), a transition command (e.g., 702) to a power-distribution node (e.g., 108) of a data center (e.g., 106) to transition an outlet of the power-distribution node between power states.

In various aspects, act 1404 can include verifying, by the device (e.g., verification component 120), that a power-consumption node (e.g., 110(1)) of the data center is connected to the outlet of the power-distribution node by comparing (e.g., 902) a pre-transition power characteristic (e.g., 602) of the power-consumption node with a post-transition power characteristic (e.g., 802) of the power-consumption node.

Figure 15:
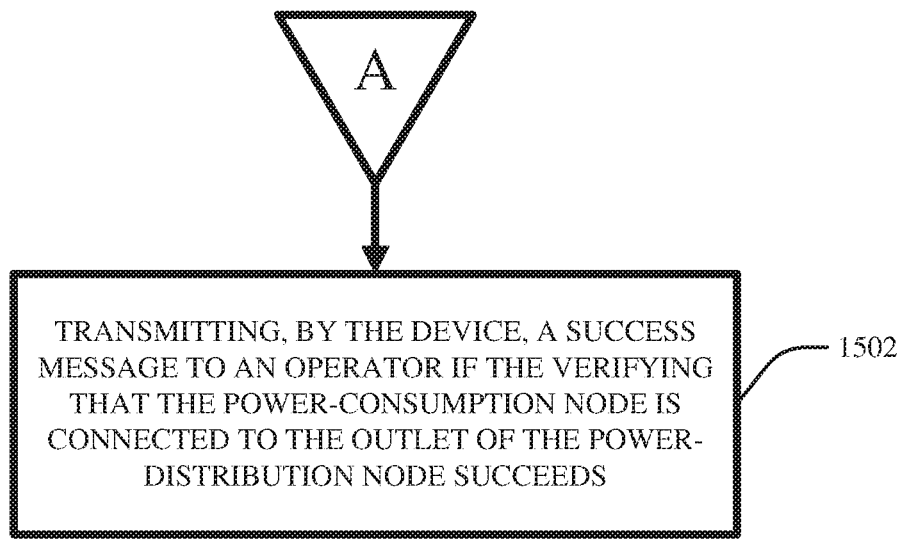
FIG. 15 illustrates a flow diagram of an example, non-limiting computer-implemented method including a success message that facilitates automated validation of power topology via power state transitioning in accordance with one or more embodiments described herein.

FIG. 15 illustrates a flow diagram of an example, non-limiting computer-implemented method 1500 including a success message that can facilitate automated validation of power topology via power state transitioning in accordance with one or more embodiments described herein. As shown, the computer-implemented method 1500 can, in various embodiments, comprise the same acts as the computer-implemented method 1400, and can further comprise act 1502.

In various embodiments, act 1502 can include transmitting, by the device (e.g., alert component 1102), a success message to an operator if the verifying that the power-consumption node is connected to the outlet of the power-distribution node succeeds.

Figure 16:
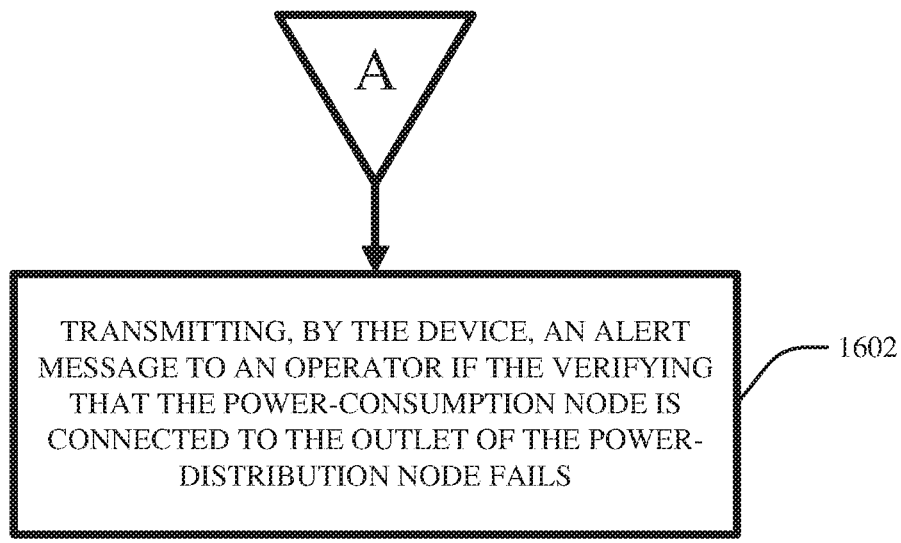
FIG. 16 illustrates a flow diagram of an example, non-limiting computer-implemented method including an alert message that facilitates automated validation of power topology via power state transitioning in accordance with one or more embodiments described herein.

FIG. 16 illustrates a flow diagram of an example, non-limiting computer-implemented method 1600 including an alert message that can facilitate automated validation of power topology via power state transitioning in accordance with one or more embodiments described herein. As shown, the computer-implemented method 1600 can, in various embodiments, comprise the same acts as the computer-implemented method 1400, and can further comprise act 1602.

In various embodiments, act 1602 can include transmitting, by the device (e.g., alert component 1102), an alert message to an operator if the verifying that the power-consumption node is connected to the outlet of the power-distribution node fails.

Figure 17:
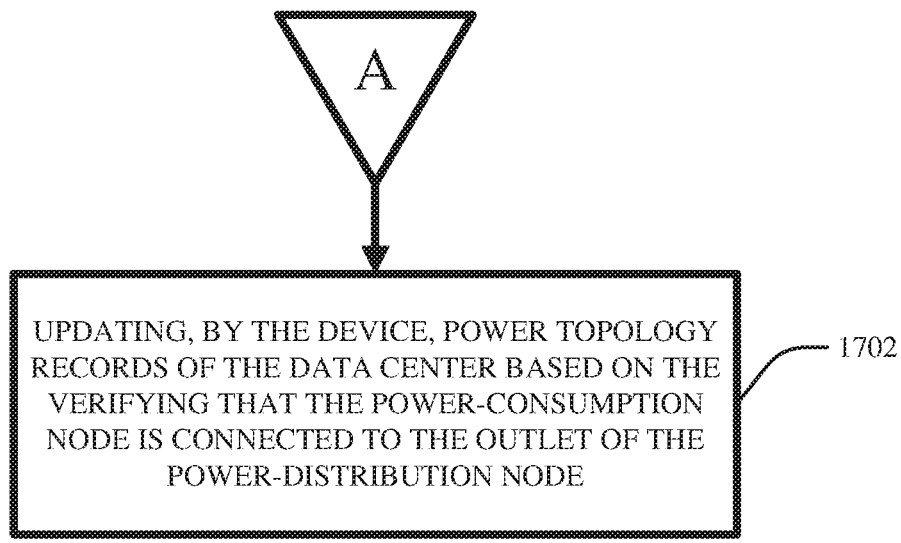
FIG. 17 illustrates a flow diagram of an example, non-limiting computer-implemented method including updating power topology records that facilitates automated validation of power topology via power state transitioning in accordance with one or more embodiments described herein.

FIG. 17 illustrates a flow diagram of an example, non-limiting computer-implemented method 1700 including updating power topology records that can facilitate automated validation of power topology via power state transitioning in accordance with one or more embodiments described herein. As shown, the computer-implemented method 1700 can, in various embodiments, comprise the same acts as the computer-implemented method 1400, and can further comprise act 1702.

In various embodiments, act 1702 can include updating, by the device (e.g., update component 1202), power topology records (e.g., 104) of the data center based on the verifying that the power-consumption node is connected to the outlet of the power-distribution node.

Figure 18:
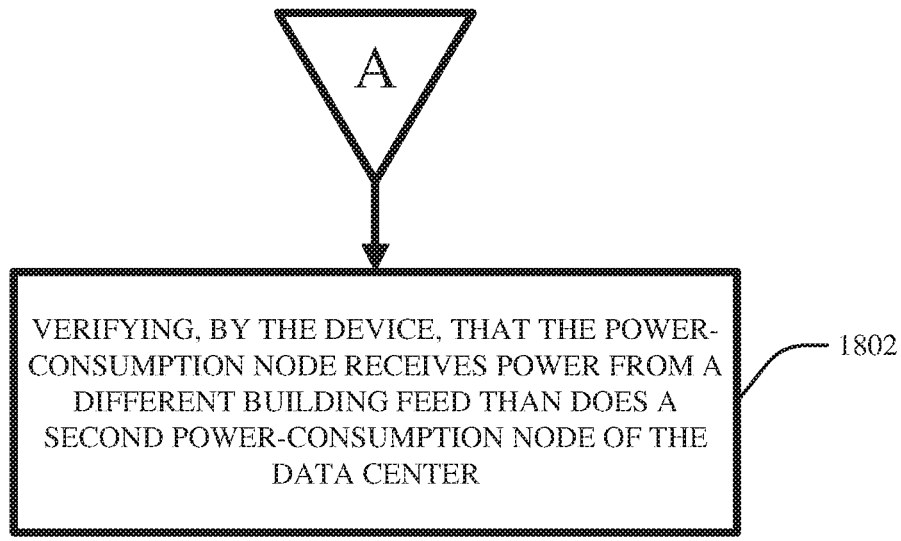
FIG. 18 illustrates a flow diagram of an example, non-limiting computer-implemented method including verifying separate power connections that facilitates automated validation of power topology via power state transitioning in accordance with one or more embodiments described herein.

FIG. 18 illustrates a flow diagram of an example, non-limiting computer-implemented method 1800 including verifying separate power connections that can facilitate automated validation of power topology via power state transitioning in accordance with one or more embodiments described herein. As shown, the computer-implemented method 1800 can, in various embodiments, comprise the same acts as the computer-implemented method 1400, and can further comprise act 1802.

In various embodiments, act 1802 can include verifying, by the device (e.g., verification component 120), that the power consumption node (e.g., 1304A) receives power from a different building feed (e.g., A-side building feed in FIG. 13) than does a second power-consumption node (e.g., 1304B) in the data center.

Figure 19:
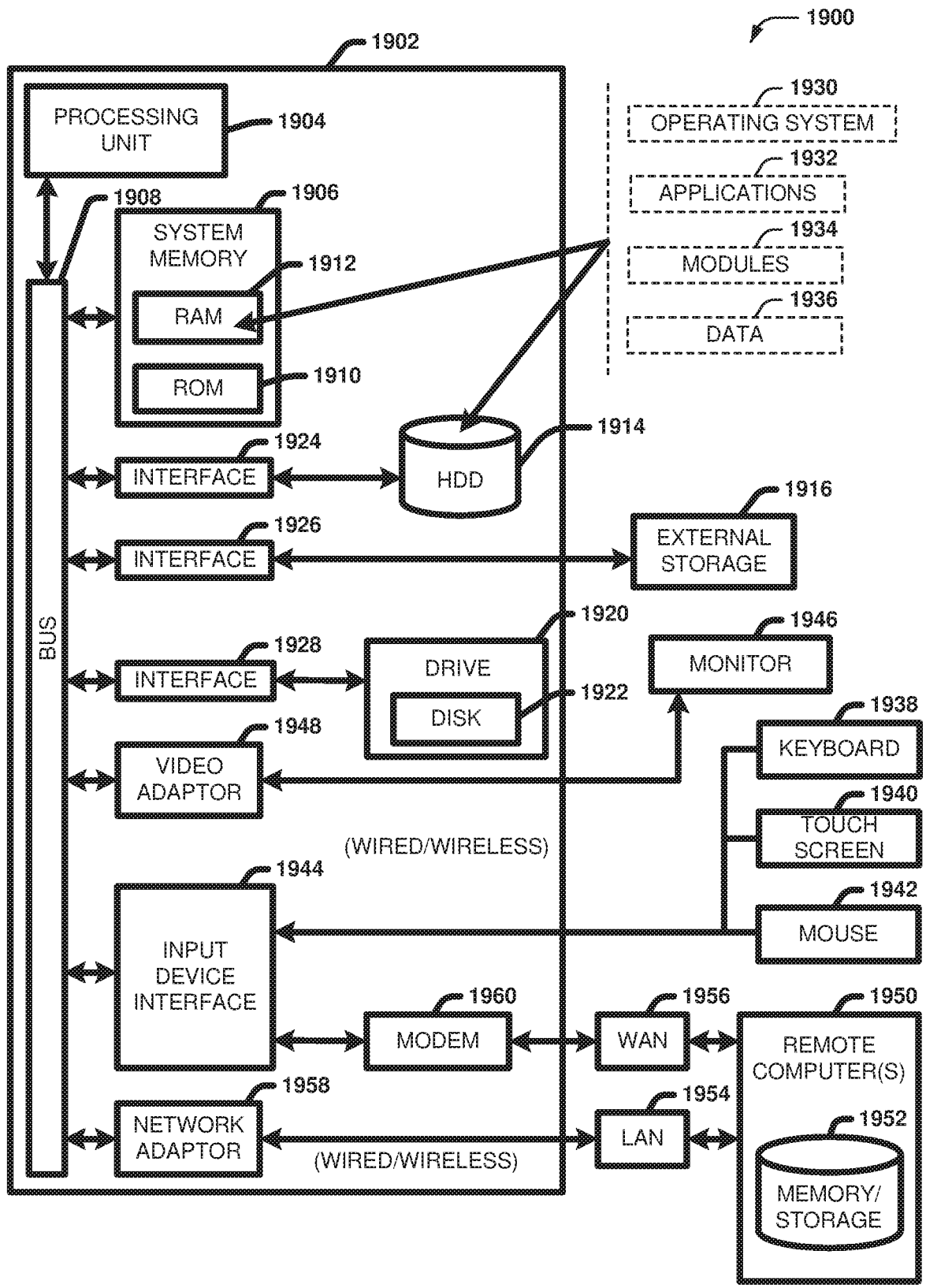
FIG. 19 illustrates a block diagram of an example, non-limiting operating environment in which one or more embodiments described herein can be facilitated.

In order to provide additional context for various embodiments described herein, FIG. 19 and the following discussion are intended to provide a general description of a suitable computing environment 1900 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 19, the example environment 1900 for implementing various embodiments of the aspects described herein includes a computer 1902, the computer 1902 including a processing unit 1904, a system memory 1906 and a system bus 1908. The system bus 1908 couples system components including, but not limited to, the system memory 1906 to the processing unit 1904. The processing unit 1904 can be any of various commercially available processors. Dual microprocessors and other multi-processor architectures can also be employed as the processing unit 1904.

The system bus 1908 can be any of several types of bus structure that can further interconnect to a memory bus (with or without a memory controller), a peripheral bus, and a local bus using any of a variety of commercially available bus architectures. The system memory 1906 includes ROM 1910 and RAM 1912. A basic input/output system (BIOS) can be stored in a non-volatile memory such as ROM, erasable programmable read only memory (EPROM), EEPROM, which BIOS contains the basic routines that help to transfer information between elements within the computer 1902, such as during startup. The RAM 1912 can also include a high-speed RAM such as static RAM for caching data.

The computer 1902 further includes an internal hard disk drive (HDD) 1914 (e.g., EIDE, SATA), one or more external storage devices 1916 (e.g., a magnetic floppy disk drive (FDD) 1916, a memory stick or flash drive reader, a memory card reader, etc.) and a drive 1920, e.g., such as a solid state drive, an optical disk drive, which can read or write from a disk 1922, such as a CD-ROM disc, a DVD, a BD, etc. Alternatively, where a solid state drive is involved, disk 1922 would not be included, unless separate. While the internal HDD 1914 is illustrated as located within the computer 1902, the internal HDD 1914 can also be configured for external use in a suitable chassis (not shown). Additionally, while not shown in environment 1900, a solid state drive (SSD) could be used in addition to, or in place of, an HDD 1914. The HDD 1914, external storage device(s) 1916 and drive 1920 can be connected to the system bus 1908 by an HDD interface 1924, an external storage interface 1926 and a drive interface 1928, respectively. The interface 1924 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1902, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1912, including an operating system 1930, one or more application programs 1932, other program modules 1934 and program data 1936. All or portions of the operating system, applications, modules, and/or data can also be cached in the RAM 1912. The systems and methods described herein can be implemented utilizing various commercially available operating systems or combinations of operating systems.

Computer 1902 can optionally comprise emulation technologies. For example, a hypervisor (not shown) or other intermediary can emulate a hardware environment for operating system 1930, and the emulated hardware can optionally be different from the hardware illustrated in FIG. 19. In such an embodiment, operating system 1930 can comprise one virtual machine (VM) of multiple VMs hosted at computer 1902. Furthermore, operating system 1930 can provide runtime environments, such as the Java runtime environment or the .NET framework, for applications 1932. Runtime environments are consistent execution environments that allow applications 1932 to run on any operating system that includes the runtime environment. Similarly, operating system 1930 can support containers, and applications 1932 can be in the form of containers, which are lightweight, standalone, executable packages of software that include, e.g., code, runtime, system tools, system libraries and settings for an application.

Further, computer 1902 can be enable with a security module, such as a trusted processing module (TPM). For instance with a TPM, boot components hash next in time boot components, and wait for a match of results to secured values, before loading a next boot component. This process can take place at any layer in the code execution stack of computer 1902, e.g., applied at the application execution level or at the operating system (OS) kernel level, thereby enabling security at any level of code execution.

A user can enter commands and information into the computer 1902 through one or more wired/wireless input devices, e.g., a keyboard 1938, a touch screen 1940, and a pointing device, such as a mouse 1942. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1904 through an input device interface 1944 that can be coupled to the system bus 1908, but can be connected by other interfaces, such as a parallel port, an IEEE 1394 serial port, a game port, a USB port, an IR interface, a BLUETOOTH® interface, etc.

A monitor 1946 or other type of display device can be also connected to the system bus 1908 via an interface, such as a video adapter 1948. In addition to the monitor 1946, a computer typically includes other peripheral output devices (not shown), such as speakers, printers, etc.

The computer 1902 can operate in a networked environment using logical connections via wired and/or wireless communications to one or more remote computers, such as a remote computer(s) 1950. The remote computer(s) 1950 can be a workstation, a server computer, a router, a personal computer, portable computer, microprocessor-based entertainment appliance, a peer device or other common network node, and typically includes many or all of the elements described relative to the computer 1902, although, for purposes of brevity, only a memory/storage device 1952 is illustrated. The logical connections depicted include wired/wireless connectivity to a local area network (LAN) 1954 and/or larger networks, e.g., a wide area network (WAN) 1956. Such LAN and WAN networking environments are commonplace in offices and companies, and facilitate enterprise-wide computer networks, such as intranets, all of which can connect to a global communications network, e.g., the Internet.

When used in a LAN networking environment, the computer 1902 can be connected to the local network 1954 through a wired and/or wireless communication network interface or adapter 1958. The adapter 1958 can facilitate wired or wireless communication to the LAN 1954, which can also include a wireless access point (AP) disposed thereon for communicating with the adapter 1958 in a wireless mode.

When used in a WAN networking environment, the computer 1902 can include a modem 1960 or can be connected to a communications server on the WAN 1956 via other means for establishing communications over the WAN 1956, such as by way of the Internet. The modem 1960, which can be internal or external and a wired or wireless device, can be connected to the system bus 1908 via the input device interface 1944. In a networked environment, program modules depicted relative to the computer 1902 or portions thereof, can be stored in the remote memory/storage device 1952. It will be appreciated that the network connections shown are example and other means of establishing a communications link between the computers can be used.

When used in either a LAN or WAN networking environment, the computer 1902 can access cloud storage systems or other network-based storage systems in addition to, or in place of, external storage devices 1916 as described above, such as but not limited to a network virtual machine providing one or more aspects of storage or processing of information. Generally, a connection between the computer 1902 and a cloud storage system can be established over a LAN 1954 or WAN 1956 e.g., by the adapter 1958 or modem 1960, respectively. Upon connecting the computer 1902 to an associated cloud storage system, the external storage interface 1926 can, with the aid of the adapter 1958 and/or modem 1960, manage storage provided by the cloud storage system as it would other types of external storage. For instance, the external storage interface 1926 can be configured to provide access to cloud storage sources as if those sources were physically connected to the computer 1902.

The computer 1902 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 20:
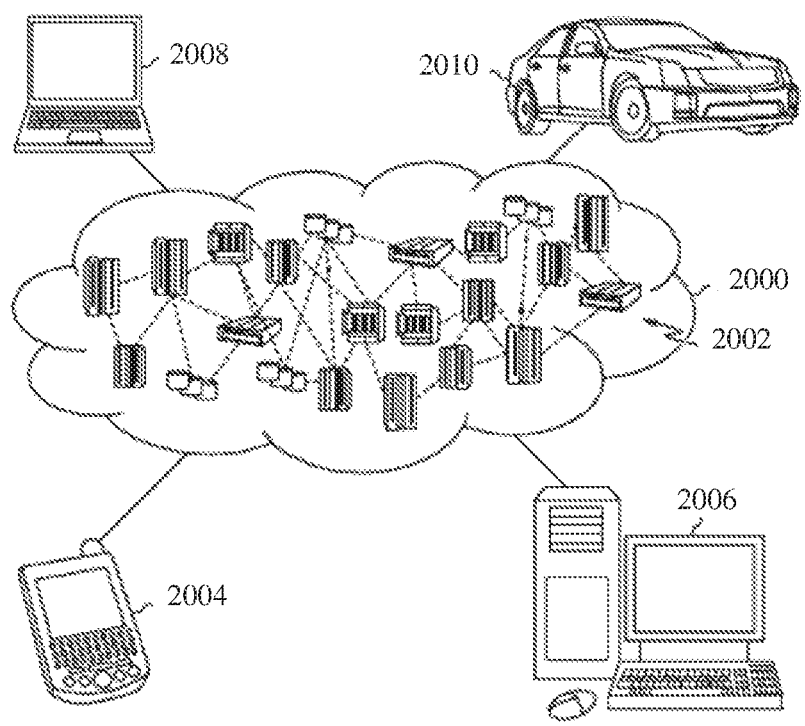
FIG. 20 illustrates an example, non-limiting cloud computing environment in accordance with one or more embodiments described herein.

Referring now to FIG. 20, illustrative cloud computing environment 2000 is depicted. As shown, cloud computing environment 2000 includes one or more cloud computing nodes 2002 with which local computing devices used by cloud consumers, such as, for example, personal digital assistant (PDA) or cellular telephone 2004, desktop computer 2006, laptop computer 2008, and/or automobile computer system 2010 may communicate. Nodes 2002 may communicate with one another. They may be grouped (not shown) physically or virtually, in one or more networks, such as Private, Community, Public, or Hybrid clouds as described hereinabove, or a combination thereof. This allows cloud computing environment 2000 to offer infrastructure, platforms and/or software as services for which a cloud consumer does not need to maintain resources on a local computing device. It is understood that the types of computing devices 2004-2010 shown in FIG. 20 are intended to be illustrative only and that computing nodes 2002 and cloud computing environment 2000 can communicate with any type of computerized device over any type of network and/or network addressable connection (e.g., using a web browser).

Figure 21:
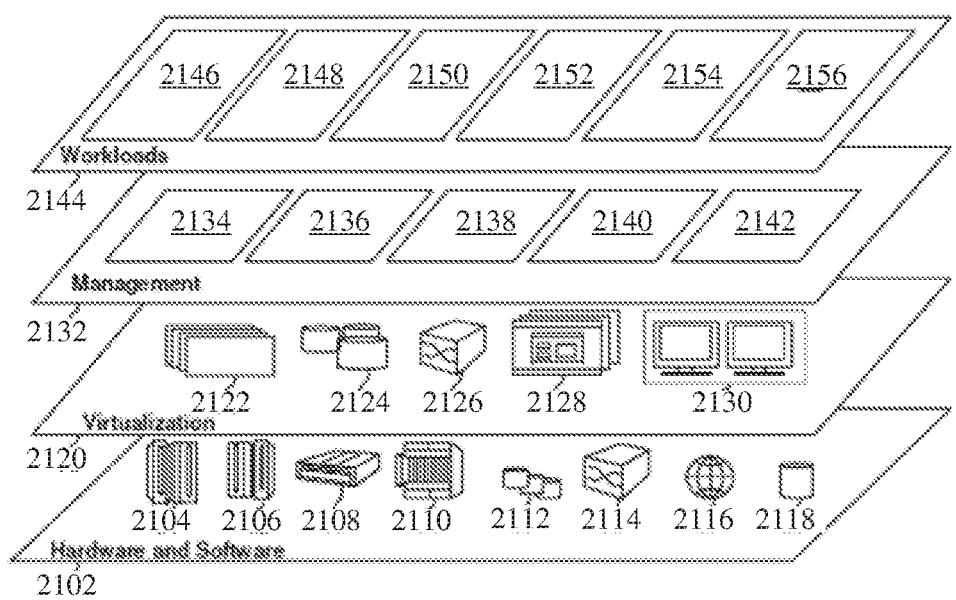
FIG. 21 illustrates example, non-limiting abstraction model layers in accordance with one or more embodiments described herein.

Referring now to FIG. 21, a set of functional abstraction layers provided by cloud computing environment 2000 (FIG. 20) is shown. Repetitive description of like elements employed in other embodiments described herein is omitted for sake of brevity. It should be understood in advance that the components, layers, and functions shown in FIG. 21 are intended to be illustrative only and embodiments of the invention are not limited thereto. As depicted, the following layers and corresponding functions are provided.

Hardware and software layer 2102 includes hardware and software components. Examples of hardware components include: mainframes 2104; RISC (Reduced Instruction Set Computer) architecture based servers 2106; servers 2108; blade servers 2110; storage devices 2112; and networks and networking components 2114. In some embodiments, software components include network application server software 2116 and database software 2118.

Virtualization layer 2120 provides an abstraction layer from which the following examples of virtual entities may be provided: virtual servers 2122; virtual storage 2124; virtual networks 2126, including virtual private networks; virtual applications and operating systems 2128; and virtual clients 2130.

In one example, management layer 2132 may provide the functions described below. Resource provisioning 2134 provides dynamic procurement of computing resources and other resources that are utilized to perform tasks within the cloud computing environment. Metering and Pricing 2136 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 2138 provides access to the cloud computing environment for consumers and system administrators. Service level management 2140 provides cloud computing resource allocation and management such that required service levels are met. Service Level Agreement (SLA) planning and fulfillment 2142 provide pre-arrangement for, and procurement of, cloud computing resources for which a future requirement is anticipated in accordance with an SLA.

Workloads layer 2144 provides examples of functionality for which the cloud computing environment may be utilized. Examples of workloads and functions which may be provided from this layer include: mapping and navigation 2146; software development and lifecycle management 2148; virtual classroom education delivery 2150; data analytics processing 2152; transaction processing 2154; and differentially private federated learning processing 2156. Various embodiments of the present invention can utilize the cloud computing environment described with reference to FIGS. 20 and 21 to execute one or more differentially private federated learning process in accordance with various embodiments described herein.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a processor, operably coupled to a memory, that executes computer-executable components stored in the memory, wherein the computer-executable components comprise:
a control component that transmits a transition command to a power-distribution node of a data center to transition an outlet of the power-distribution node between power states;
a verification component that verifies that a power-consumption node of the data center is connected to the outlet by comparing a pre-transition power characteristic of the power-consumption node with a post-transition power characteristic of the power-consumption node; and
an alert component that:
transmits an alert message to an operator based on a determination of the verification component failing to verify that the power-consumption node is connected to the outlet of the power-distribution node and failing to verify that a defined power connection in a power topology record matches a physical power topology of the data center; and
automatically schedules a maintenance provider for the data center and informs the maintenance provider that the defined power connection was not validated.

2. The system of claim 1, wherein the alert component transmits a success message to an operator based on a determination of the verification component verification of that the power-consumption node is connected to the outlet of the power-distribution node.

3. The system of claim 1, further comprising:
an update component that updates power topology records of the data center based on verification by the verification component.

4. The system of claim 1, wherein the pre-transition and post-transition power characteristics comprise at least one of: a power measurement, a voltage measurement, or a current measurement.

5. The system of claim 1, wherein the power-distribution node is a rack power distribution unit and the power-consumption node is a power-supply unit of a server, or wherein the power-distribution node is a remote power panel circuit and the power-consumption node is a rack power distribution unit.

6. The system of claim 1, wherein the verification component verifies that the power-consumption node receives power from a different building feed than does a second power-consumption node of the data center.

7. A computer-implemented method, comprising:
transmitting, by a device operatively coupled to a processor, a transition command to a power-distribution node of a data center to transition an outlet of the power-distribution node between power states;
verifying, by the device, that a power-consumption node of the data center is connected to the outlet by comparing a pre-transition power characteristic of the power-consumption node with a post-transition power characteristic of the power-consumption node; and
and
transmitting, by the device, an alert message to an operator based on a determination of the verification component failing to verify that the power-consumption node is connected to the outlet of the power-distribution node and failing to verify that a defined power connection in a power topology record matches a physical power topology of the data center; and
automatically contacting, by the device, a maintenance provider for the data center and informing the maintenance provider that the defined power connection was not validated.

8. The computer-implemented method of claim 7, further comprising:
transmitting, by the device, a success message to an operator based on a determination that the verifying that the power-consumption node is connected to the outlet of the power-distribution node succeeds.

9. The computer-implemented method of claim 7, further comprising:
updating, by the device, power topology records of the data center based on the verifying that the power-consumption node is connected to the outlet of the power-distribution node.

10. The computer-implemented method of claim 7, wherein the pre-transition and post-transition power characteristics comprise at least one of: a power measurement, a voltage measurement, or a current measurement.

11. The computer-implemented method of claim 7, wherein the power-distribution node is a rack power distribution unit and the power-consumption node is a power-supply unit of a server, or wherein the power-distribution node is a remote power panel circuit and the power-consumption node is a rack power distribution unit.

12. The computer-implemented method of claim 7, further comprising:
verifying, by the device, that the power-consumption node receives power from a different building feed than does a second-power consumption node of the data center.

13. A computer program product for facilitating automated validation of power topology via power state transitioning, the computer program product comprising a non-transitory computer readable memory having program instructions embodied therewith, the program instructions executable by a processing component to cause the processing component to:

transmit a transition command to a power-distribution node of a data center to transition an outlet of the power-distribution node between power states;

verify that a power-consumption node of the data center is connected to the outlet by comparing a pre-transition power characteristic of the power-consumption node with a post-transition power characteristic of the power-consumption node; and and transmit an alert message to an operator based on a determination of the verification component failing to verify that the power-consumption node is connected to the outlet of the power-distribution node and failing to verify that a defined power connection in a power topology record matches a physical power topology of the data center.

14. The computer program product of claim 13, wherein the program instructions are further executable to cause the processing component to:

transmit a success message to an operator based on a determination of the processing component verification that the power-consumption node is connected to the outlet of the power-distribution node.

15. The computer program product of claim 13, wherein the program instructions are further executable to cause the processing component to:

update power topology records of the data center based on the processing component verifying that the power-consumption node is connected to the outlet of the power-distribution node.

16. The computer program product of claim 13, wherein the pre-transition and post-transition power characteristics comprise at least one of: a power measurement, a voltage measurement, or a current measurement.

17. The computer program product of claim 13, wherein the power-distribution node is a rack power distribution unit and the power-consumption node is a power-supply unit of a server, or wherein the power-distribution node is a remote power panel circuit and the power-consumption node is a rack power distribution unit.

* * * * *